United States Patent [19]
Katayama et al.

[11] Patent Number: 5,821,814
[45] Date of Patent: Oct. 13, 1998

[54] NEGATIVE FEEDBACK AMPLIFIER

[75] Inventors: Masatoshi Katayama; Masamichi Nogami; Kuniaki Motoshima, all of Tokyo, Japan

[73] Assignee: Mitsubishi Denki Kabushiki Kaisha, Japan

[21] Appl. No.: 768,285

[22] Filed: Dec. 17, 1996

[30] Foreign Application Priority Data

Jun. 25, 1996 [JP] Japan ................................. 8-164831

[51] Int. Cl.$^6$ ................................. H03F 1/34; H03G 3/30
[52] U.S. Cl. ............. 330/277; 250/214 A; 250/214 AG; 330/110; 330/282; 330/308
[58] Field of Search .................. 330/59, 110, 277, 330/282, 308; 250/214 A, 214 AG; 359/189, 194

[56] References Cited

U.S. PATENT DOCUMENTS 5,363,064  11/1994  Mikamura ..................... 250/214 AG
5,525,929   6/1996  Nagahori et al. ............... 330/308 X

FOREIGN PATENT DOCUMENTS 60-81930  5/1985  Japan .
2217010   8/1990  Japan .

*Primary Examiner*—James B. Mullins
*Attorney, Agent, or Firm*—Rothwell, Figg, Ernst & Kurz, p.c.

[57] ABSTRACT

A negative feedback preamplifier having variable conversion gain control and variable open loop gain control capabilities which can work correctly regardless of semiconductor process variations. The negative feedback preamplifier used to convert an input signal current to a signal in the form of voltage includes: a resistor which determines the current-voltage conversion gain when a small signal current is input to the negative feedback preamplifier; a diode which switches the current-voltage conversion gain when a large signal current is input to the negative feedback preamplifier; a resistor which determines the current-voltage conversion gain when the large signal current is input; a grounded source amplifier including a main FET which is biased such that its transconductance decreases when the large signal current is input; and a bias setting portion (diode) which determines the bias condition associated with the main FET.

17 Claims, 11 Drawing Sheets

NEGATIVE FEEDBACK AMPLIFIER

BACKGROUND OF THE INVENTION

1. Field of the Invention

The present invention relates to a negative feedback preamplifier with an automatic gain control (AGC) circuit suitable for use as a negative feedback preamplifier in an optical receiver for converting a continuous- or burst-type optical signal into an electric signal.

2. Description of the Related Art

FIG. 17 is a circuit diagram illustrating a known negative feedback preamplifier in the simplest form. In FIG. 17, reference numeral 1 denotes a main FET. The drain of the main FET 1 is connected to the source of a load FET 2 whose gate and source are connected to each other and further connected to a power supply voltage VDD. The source of the main FET 1 is grounded. An input parasitic capacitance 3 associated with a photodiode or the like is present between the gate and source of the main FET 1. The main FET 1 and the load FET 2 form a grounded source amplifier.

The gate of the main FET 1 is connected to a feedback resistor. There is also provided a source follower FET 5 whose drain is connected to the drain of the load FET 2 (and thus also to the power supply voltage $V_{DD}$) and whose gate is connected to the source of the load FET 2 whereby an output $V_0$ is provided at the source of the source follower FET 5.

A plurality (xN) of bias setting diodes 6 connected in series are disposed between the source of the source follower FET 5 and the other end of the feedback resistor 4 in such a manner that the anode end of the series of bias setting diodes 6 is connected to the source of the source follower FET 5.

A constant-current source FET 7, whose gate and source are connected to each other, is disposed between the other end of the feedback resistor 4 and a power supply voltage $V_{SS}$ ($V_{SS}<V_{DD}$) in such a manner that the drain of the constant-current source FET 7 is connected to the other end of the feedback resistor 4 and the source (gate) of the constant-current source FET 7 is connected to the power supply voltage $V_{SS}$. The main FET 1, the series of bias setting diodes 6, and the constant-current source FET 7 form a source follower circuit connected to the main FET 1.

The negative feedback preamplifier shown in FIG. 17 has no capability of automatic gain control. The output voltage $V_0$ of this negative feedback preamplifier is determined by an input current Ii and the resistance $R_f$ of the feedback resistor 4 as follows:

$$-V_0 \approx R_f I_i \qquad (1)$$

The frequency band $F_c$ of the negative feedback preamplifier is determined by the resistance $R_f$ of the feedback resistor 4, the capacitance value $C_i$ of the input parasitic capacitance 3, and the open loop gain A of the amplifier, as represented by the following equation (2):

$$F_c = (1+A)/(2\pi R_f C_i) \qquad (2)$$

The open loop gain A of the amplifier is determined by the AC resistance $R_1$ of the load FET 2, the transconductance $g_m$ of FET 1, and the AC resistance $R_m$ of the main FET 1 as represented by the following equation (3):

$$A = g_m/(1/R_1 + 1/R_m) \qquad (3)$$

In general, the minimum input of the amplifier can accept is limited by noise. A major component of the noise of the negative feedback amplifier is thermal noise. To minimize the thermal noise, it is required that the resistance $R_f$ of the feedback resistor 4 be large enough.

On the other hand, the maximum input is limited by saturation of a FET caused by a change of the bias point in the circuit. To prevent the saturation of the FET, it is effective to reduce the resistance $R_1$ of the feedback resistor 4. However, this is against the former requirement in terms of noise reduction. One known technique to satisfy both the requirements is to add the capability of automatic gain control to the amplifier.

FIG. 18 is a circuit diagram illustrating an example of a known negative feedback preamplifier having the capability of automatic gain control.

In addition to the circuit components shown in FIG. 17, the negative feedback preamplifier with the capability of automatic gain control shown in FIG. 18 further includes: a diode 8 connected in parallel to the feedback resistor 4 in such a manner that the anode of the diode is connected to the gate of the main FET 1 whereby the current-voltage conversion gain is switched when a large signal current is input to the negative feedback preamplifier; and a series of a plurality (K) of diodes 9 disposed between the drain and the source of the load FET 2 in such a manner that the anode end of the series of diodes 9 is connected to the drain of the load FET 2 and the cathode end of the series of diodes 9 is connected to the source of the load FET 2 whereby the open loop gain is switched when a large signal current is input to the amplifier.

In this negative feedback preamplifier with the capability of automatic gain control, the conversion gain and the open loop gain are variably controlled by the automatic gain control circuit as described below.

When a large signal current is input to this negative feedback preamplifier, the diode 8 is turned on and thus the effective resistance of the feedback resistor 4 becomes low, which results in a reduction in the current-voltage conversion gain. In this way, the variable conversion gain control is performed in this preamplifier.

The effective resistance of the feedback resistor 4 is given by the parallel resistance of the intrinsic resistance $R_f$ and the on-resistance $R_d$ of the diode 8. Since the resistance $R_f$ is much greater than the resistance $R_d$, the effective resistance of the feedback resistor 4 is determined substantially by the resistance $R_d$.

FIG. 19 illustrates a typical current-voltage characteristic of the diode. If the turn-on voltage of the diode 8 is given as $V_f$, the input-output characteristic is given by the following equation (4):

$$\begin{aligned}-V_0 &= [R_r/(R_f+R_4)] \cdot V_i + [(R_f \cdot R_4)/(R_f+R_6)] \cdot I_i \\ &\approx V_f + R_d \cdot I_i \; (\because R_r >> R_d)\end{aligned} \qquad (4)$$

Under the high input signal condition, as can be understood from equation (2), the frequency bandwidth becomes very large due to the reduced effective feedback resistance 4. This can cause circuit instability. To avoid the above problem, the amplifier has the capability of variable open loop gain control so that the open loop gain is reduced when a large signal current is input to the amplifier.

Under the high input signal condition, as can be understood from equation (4), the voltage at the node A shown in FIG. 18 decreases by $V_{ss}+R_d-I_i$, and thus a corresponding increase occurs in the voltage across the load FET 2. The increase in the voltage across the load FET 2 causes the diode 9 to turn on, and thus the effective load resistance decreases. This results in a reduction in the open loop gain A represented by equation (3).

When the preamplifier is in the above condition, the drain-source voltage $V_d$ of the main FET 1 can decrease down to a level smaller than the pinch-off voltage Vp, which will lead to a reduction in transconductance gm of the main FET 1. To prevent such the reduction in the drain-source voltage Vds of the main FET 1, the number of bias setting diodes 6 is selected to be a large enough (there are xN diodes in the example shown in FIG. 18). The diodes 8 and 9 can be switched from bit to bit, and thus this circuit can also respond to bust-type input signals.

In the known circuit shown in FIG. 18, as described above, the effective resistance of the feedback resistor 4 in the high input signal condition is substantially by the on-resistance $R_d$ of the diode 8. However, the on-resistance $R_d$ of the diode varies with semiconductor process variations during manufacturing of the diode. Therefore, the performance of the variable conversion gain control depends on the semiconductor process variations.

In the known circuit shown in FIG. 18, it is required that the voltage across the load or the source-drain voltage of the load FET 2 be adjusted so that the input current required to turn on the diode 8 is equal to the input current required to turn on the diode 9. However, this voltage across the load varies with the variation in the power supply voltage $V_{DD}$.

When the power supply voltage $V_{DD}$ having a specific value is given, it is possible to adjust the voltage which appears at the point A with respect to the ground voltage when no signal is input, by properly selecting the number of diodes 6 and/or the size (area) of the diodes 6.

However, if a variation occurs in the power supply voltage $V_{DD}$, a corresponding variation occurs in the voltage across the load and thus a variation occurs in the threshold input current at which the diode 9 turns on. Therefore, when the input signal current has a certain value which causes the diode 8 to turn on, the diode 9 can still remain in an off-state.

This causes an increase in the frequency bandwidth to an unnecessarily large level, which results in circuit instability. Thus, the operation of the variable open loop gain control depends on the power supply voltage.

SUMMARY OF THE INVENTION

Accordingly, it is a general object of the present invention to solve the above problems. More specifically, it is an object of the present invention to provide a negative feedback preamplifier with the capability of variable conversion gain control which does not depend on the semiconductor process variations which occur during production.

It is another object of the present invention to provide a negative feedback preamplifier with the capability of open loop gain control which works correctly regardless of the variation in the power supply voltage.

To achieve the above object, according to one aspect of the present invention, there is provided a negative feedback preamplifier comprising: a grounded source amplifier including a main FET and a load FET, the source of the main FET being grounded, the drain of the load FET being connected to a positive power supply, the source of the load FET being connected to the drain of the main FET, the gate and the source of the load FET being connected to each other; a source follower circuit including: a source follower FET whose drain is connected to the positive power supply and whose gate is connected to the source of the load FET and whose source serves to provide an output; a bias setting portion connected to the source of the source follower FET, for setting the bias associated with the main FET; and a constant-current source FET whose drain is connected to the other terminal of the bias setting portion, and whose gate and source are connected to each other and further connected to a negative power supply with a voltage lower than that of the positive power supply; a feedback resistor connected between the gate of the main FET and the drain of the constant-current source FET, the feedback resistor serving to determine the current-voltage conversion gain when a small signal current is input to the negative feedback preamplifier; and a series connection of a diode and a resistor which is connected in parallel to the feedback resistor in such a manner that the anode of the diode is connected to the gate of the main FET wherein when a large signal current is input to the negative feedback preamplifier, the current-voltage conversion gain is switched by the diode and the current-voltage conversion gain is determined by the resistor.

Preferably, the bias setting portion sets the bias condition so that when a large signal current is input to the negative feedback amplifier, the drain-source voltage of the main FET becomes equal to or smaller than the pinch-off voltage thereby reducing the transconductance of the main FET.

Alternatively, the bias setting portion may also be comprised of a plurality of bias setting diodes connected in series, the anode end of the series of bias setting diodes being connected to the source of the source follower FET, the number of bias setting diodes being selected so that when a large signal current is input to the negative feedback preamplifier the drain-source voltage of the main FET becomes equal to or smaller than the pinch-off voltage thereby reducing the transconductance of the main FET.

Still alternatively, the bias setting portion may also be composed of a Zener diode whose cathode is connected to the source of the source follower FET, the Zener voltage of the Zener diode being selected so that when a large signal current is input to the negative feedback preamplifier the drain-source voltage of the main FET becomes equal to or smaller than the pinch-off voltage thereby reducing the transconductance of the main FET.

Still alternatively, the bias setting portion may also be composed of a resistor having a resistance value selected so that when a large signal current is input to the negative feedback preamplifier the drain-source voltage of the main FET becomes equal to or smaller than the pinch-off voltage thereby reducing the transconductance of the main FET.

Preferably, the grounded source amplifier further includes: a current injection FET whose gate and source are connected to each other and further connected to the drain of the main FET so that a DC bias current is provided into the main FET; and a cascode connection FET disposed between the main FET and the load FET, the drain of the cascode connection FET being connected to the source of the load FET, the source of the cascode connection FET being connected to the drain of the main FET, the gate of the cascode connection FET being connected to a constant-voltage source, whereby the grounded source amplifier operates as a current injection type grounded source amplifier; and the bias setting portion sets the bias condition in such a manner that when a large signal current is input to the negative feedback amplifier the drain-source voltage of the cascode connection FET becomes equal to or smaller than the pinch-off voltage.

The negative feedback preamplifier may further comprise a constant voltage power supply circuit for setting the gate voltage of the cascode connection FET.

Preferably, the constant voltage power supply circuit may be composed of: a gate voltage setting constant-current source FET whose gate and source are connected to each other and further connected to the gate of the cascode connection FET; and a gate voltage setting portion for setting the gate voltage of the cascode connection FET.

Preferably, the gate voltage setting portion may be composed of a plurality of diodes connected in series, the anode end of the series of the diodes being connected to the source of the gate voltage control constant-current source FET.

Alternatively, the gate voltage setting portion may be a Zener diode whose cathode is connected to the source of the gate voltage setting constant-current source FET.

Still alternatively, the gate voltage setting portion may be a resistor.

The constant voltage power supply circuit may be a regulator which supplies a constant voltage to the gate of the cascode connection FET.

According to another aspect of the present invention, there is provided a negative feedback preamplifier comprising: a grounded source amplifier including a main FET and a load FET, the source of the main FET being grounded, the drain of the load FET being connected to a positive power supply, the source of the load FET being connected to the drain of the main FET, the gate and the source of the load FET being connected to each other; a source follower circuit including: a source follower FET whose drain is connected to the positive power supply and whose gate is connected to the source of the load FET and whose source serves to provide an output; a bias setting portion connected to the source of the source follower FET, for setting the bias associated with the main FET; and a constant-current source FET whose drain is connected to the other terminal of the bias setting portion, and whose gate and source are connected to each other and further connected to a negative power supply with a voltage lower than that of the positive power supply; and a feedback resistor connected between the gate of the main FET and the drain of the constant-current source FET, the feedback resistor serving to determine the current-voltage conversion gain when a small signal current is input to the negative feedback preamplifier; wherein when a large signal current is input to the negative feedback amplifier, the bias setting portion sets the bias condition so that the drain-source voltage of the main FET becomes equal to or smaller than the pinch-off voltage thereby reducing the transconductance of the main FET.

According to still another aspect of the present invention, there is provided a negative feedback preamplifier comprising: a grounded source amplifier including: a main FET; a source voltage setting portion disposed between the main FET and ground, for controlling the source voltage of the main FET; and a load FET whose source is connected to the drain of the main FET and whose gate and source are connected to each other; a source follower circuit including: a source follower FET whose gate is connected to the source of the load FET and whose source serves to provide an output; a bias setting portion connected to the source of the source follower FET, for setting the bias associated with the main FET; and a constant-current source FET whose drain is connected to the other terminal of the bias setting portion and whose gate and source are connected to each other and further to ground; a feedback resistor connected between the gate of the main FET and the drain of the constant-current source FET, the feedback resistor serving to determine the current-voltage conversion gain when a small signal current is input to the negative feedback preamplifier; and a series connection of a diode and a resistor which is connected in parallel to the feedback resistor in such a manner that the anode of the diode is connected to the gate of the main FET wherein when a large signal current is input to the negative feedback preamplifier, the current-voltage conversion gain is switched by the diode and the current-voltage conversion gain is determined by the resistor.

Preferably, the bias setting portion sets the bias condition so that when a large signal current is input to the negative feedback amplifier, the drain-source voltage of the main FET becomes equal to or smaller than the pinch-off voltage thereby reducing the transconductance of the main FET.

Preferably, the source voltage setting portion comprises a plurality of diodes connected in series, the anode end of the series of diodes being connected to the source of the main FET, the cathode end of the series of diodes being grounded.

Alternatively, the source voltage setting portion may be a Zener diode whose anode is connected to the source of the main FET and whose cathode is grounded.

Still alternatively, the source voltage setting portion may be a resistor disposed between the source of the main FET and ground.

According to still another aspect of the present invention, there is provided a negative feedback preamplifier comprising: a grounded source amplifier including: a main FET; a source voltage setting portion disposed between the main FET and ground, for setting the source voltage of the main FET; and a load FET whose source is connected to the drain of the main FET and whose gate and source are connected to each other; a source follower circuit including: a source follower FET whose gate is connected to the source of the load FET and whose source serves to provide an output; a bias setting portion connected to the source of the source follower FET, for setting the bias associated with the main FET; and a constant-current source FET whose drain is connected to the other terminal of the bias setting portion and whose gate and source are connected to each other and further connected to ground; and a feedback resistor connected between the gate of the main FET and the drain of the constant-current source FET, the feedback resistor serving to determine the current-voltage conversion gain when a small signal current is input to the negative feedback preamplifier; wherein when a large signal current is input to the negative feedback amplifier, the bias setting portion sets the bias condition so that the drain-source voltage of the main FET becomes equal to or smaller than the pinch-off voltage thereby reducing the transconductance of the main FET.

DESCRIPTION OF THE PREFERRED EMBODIMENTS

Embodiment 1

Figure 1:
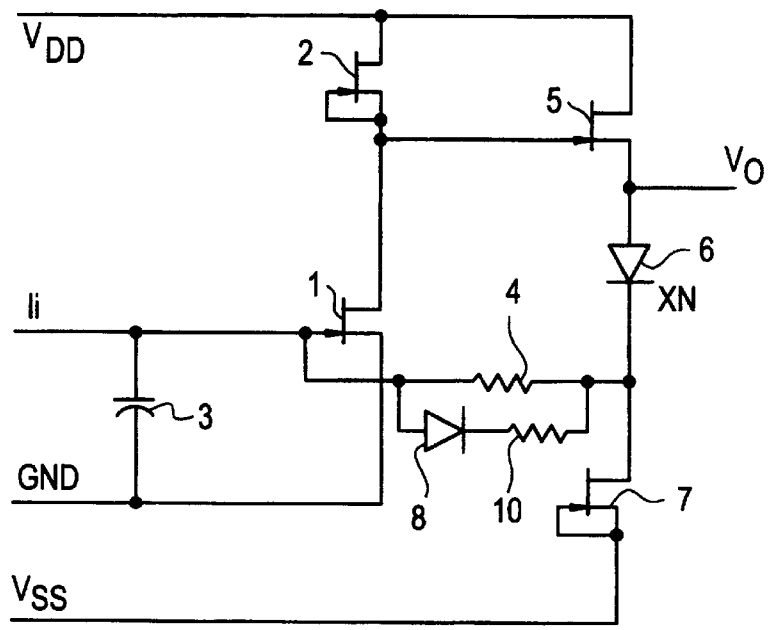
FIG. 1 shows a circuit diagram illustrating a negative feedback preamplifier according to a first embodiment of the present invention.

FIG. 1 is a circuit diagram illustrating one embodiment of a negative feedback preamplifier according to the present invention.

Figure 18:
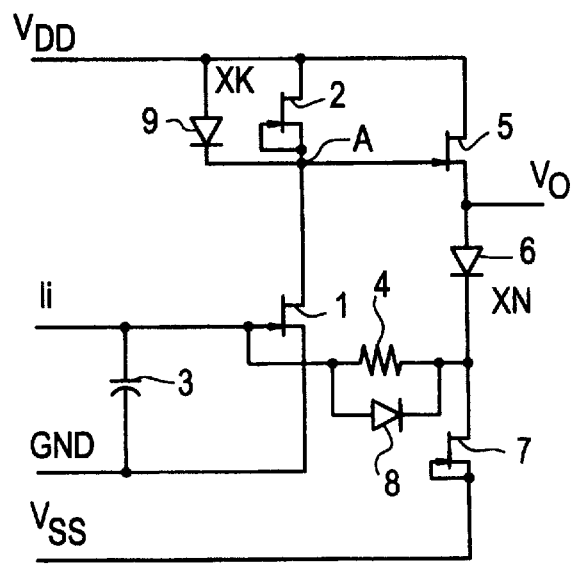
FIG. 18 shows a circuit diagram illustrating a negative feedback preamplifier having no capability of AGC, according to another privately known but unpublished technique.
Figure 19:
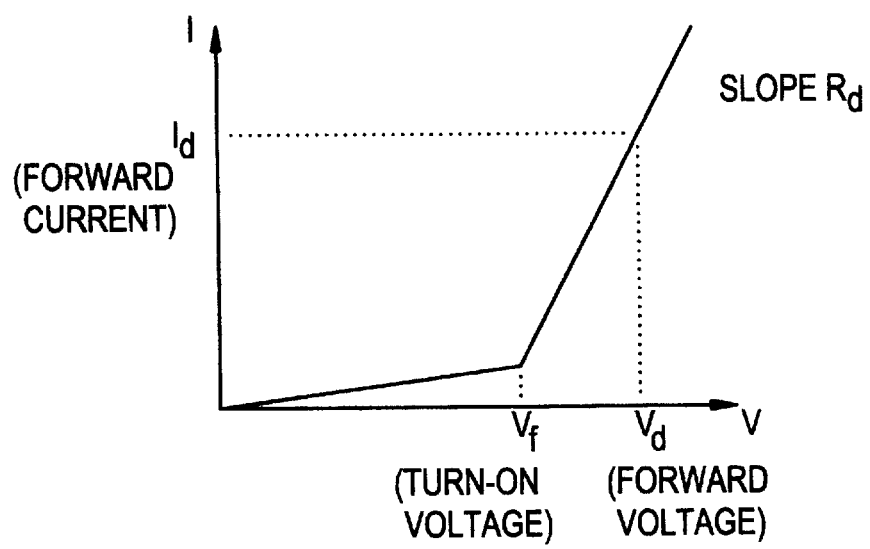
FIG. 19 shows a graph illustrating a typical diode characteristic.

In FIG. 1, similar or equivalent parts to those of FIG. 18 are denoted by similar reference numerals. In the circuit shown in FIG. 1, an FET denoted by reference numeral 1 serves as a main FET. The drain of the main FET 1 is connected to the source of a load FET 2 whose gate and source are connected to each other and further connected to a positive power supply voltage $V_{DD}$. The source of the main FET 1 is grounded. An input parasitic capacitance 3 associated with a photodiode or the like is present between the gate and source of the main FET 1. The main FET 1 and the load FET 2 form a grounded source amplifier.

The gate of the main FET 1 is connected to a feedback resistor 4. There is also provided a source follower FET 5 whose drain is connected to the drain of the load FET 2 (and thus also to the power supply voltage $V_{DD}$) and whose gate is connected to the source of the load FET 2 whereby an output $V_O$ is provided at the source of the source follower FET 5. A plurality (X N) of bias setting diodes 6 connected in series are disposed between the source of the source follower FET 5 and the other end of the feedback resistor 4 in such a manner that the anode end of the series of bias setting diodes 6 is connected to the source of the source follower FET 5.

A constant-current source FET 7, whose gate and source are connected to each other, is disposed between the other end of the feedback resistor 4 and a negative power supply voltage $V_{SS}$ ($V_{SS}<V_{DD}$) in such a manner that the drain of the constant-current source FET 7 is connected to the other end of the feedback resistor 4 and the source (gate) of the constant-current source FET 7 is connected to the power supply voltage $V_{SS}$. The main FET 1, the series of bias setting diodes 6, and the constant-current source FET 7 form a source follower circuit connected to the main FET 1.

A series connection of a diode 8 and a resistor 10 is connected in parallel to the feedback resistor 4 in such a manner that the anode of the diode 8 is connected to the gate of the main FET 1. When a large signal current is input to the negative feedback preamplifier, the current-voltage conversion gain is switched such that the current-voltage conversion gain is determined by the series of the diode 8 and the resistor 10. The resistor 10 absorbs the variation in the on-resistance $R_d$ of the diode 8 due to the semiconductor process variations thereby ensuring that the variable conversion gain control works correctly regardless of the semiconductor process variations.

That is, the circuit shown in FIG. 1 differs from the conventional circuit shown in FIG. 18 in that there is provided an additional resistor 10 connected in series to the diode 8 and the series of the resistor 10 and the diode 8 is connected in parallel to the feedback resistor 4 so that the current-voltage conversion gain in the high input signal condition is determined by the resistor 10 thereby ensuring that the variable conversion gain control works correctly regardless of the semiconductor process variations.

Now, the operation will be described below.

In the circuit shown in FIG. 1, when a large signal current is input to the circuit, the diode 8 is turned on and thus the effective resistance of the feedback resistor 4 becomes low, which results in a reduction in the current-voltage conversion gain. In this way, the variable conversion gain control is performed in this circuit.

The effective resistance value of the feedback resistor 4 is given by the parallel resistance of the intrinsic resistance $R_s$ and the series of the resistance $R_s$ of the resistor 10 and the on-resistance $R_d$ of the diode 8. If the resistance $R_d$ of the resistor 10 is selected such that $R_f \gg R_s \gg R_d$, then the input-output characteristic is given by:

$$-V_0 = \{R_f/[R_f + (R_d + R_s)]\} \cdot V_f + \quad (5)$$
$$\{[R_f(R_d + R_s)]/[R_f + (R_d + R_s)]\} \cdot I_i$$
$$\approx V_f + R_s \cdot I_i$$

As can be seen from equation (5), the variable conversion gain does not depend on the on-resistance of the diode 8.

In this embodiment, as described above, the additional resistance $R_s$ disposed in series to the diode 8 serves to determine the current-voltage conversion gain in the high input signal condition thereby ensuring that the variable conversion gain control can work correctly regardless of the semiconductor process variations.

Embodiment 2

Figure 2:
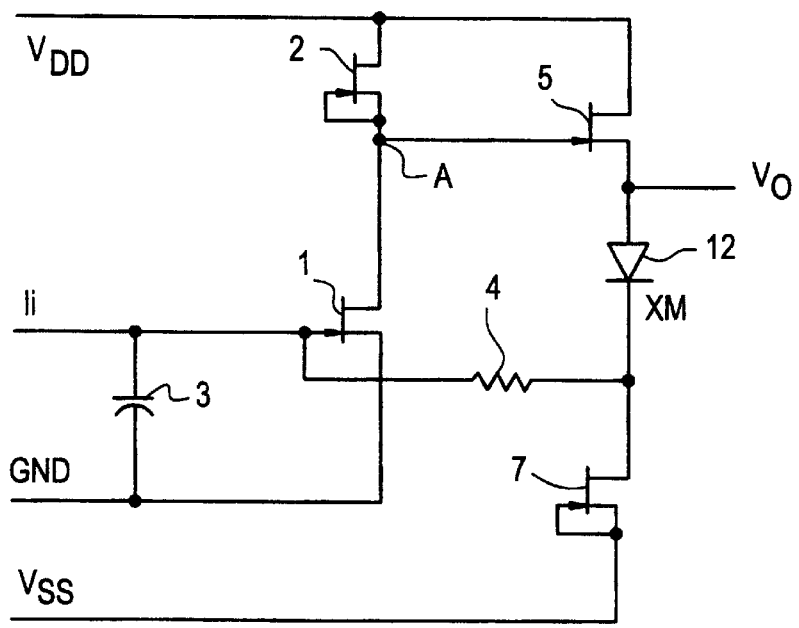
FIG. 2 shows a circuit diagram illustrating a negative feedback preamplifier according to a second embodiment of the present invention.

FIG. 2 is a circuit diagram illustrating a negative feedback preamplifier according to a second embodiment of the present invention.

In FIG. 2, reference numerals similar to those used in the known example shown in FIG. 18 denote similar parts, and they are not described herein in further detail. The circuit shown in FIG. 2 is different from the conventional circuit shown in FIG. 18 in that, instead of employing the diode 9, a series of bias setting diodes 12 is used to set the bias condition in such a manner that when a large signal current is input to the circuit, the drain-source voltage $V_d$, of the main FET 1 is reduced down to a value equal to or smaller than the pinch-off voltage $V_P$ thereby reducing the transconductance $g_m$ of the main FET 1.

The number of the bias setting diodes 12 connected in series and the size (area) of each diode is optimized for the above purpose (in the circuit shown in FIG. 2 there are M diodes as opposed to the circuit shown in FIG. 18 N diodes are used wherein M<N).

The operation will be described below.

When an input signal current $I_i$ is applied to the circuit, the potential at the point A decreases by $R_f \cdot I_i$. That is, a voltage reduction equal to $R_f \cdot I_i$ occurs in the drain-source voltage $V_d$ of the main FET 1 due to the input signal current $I_i$. If the drain-source voltage $V_d$ of the main FET 1 becomes smaller than the pinch-off voltage, a reduction occurs in the transconductance $g_m$ of the main FET 1.

Therefore, if the bias is set such that when a large signal current is input to the circuit, the drain-source voltage $V_d$ of the main FET 1 drops down to a level smaller than the pinch-off voltage $V_P$, then the above simple circuit structure has the capability of variable open gain control which can work correctly regardless of the variation in the power supply voltage.

It the number of bias setting diodes 12 is denoted by M and the forward voltage or each diode is denoted by $V_d'$, the drain-source voltage $V_d$ of the main FET 1, which is reduced by the amount of $R_f \cdot I_i$, can be represented by equation (6). Furthermore, since the drain-source voltage $V_d$ should be smaller than the pinch-off voltage $V_p$, it is required to meet equation (7).

$$V_d = M \cdot V_d' - R_f I_i \quad (6)$$

$$V_d \leq V_p \quad (7)$$

From the above equations, the following equation (8) can be deduced.

$$M \cdot V_d' V_p + R_f I_i \quad (8)$$

In order that the above circuit with the simple structure can work correctly in terms of the variable open loop gain control regardless of the variation in the power supply voltage, it is required that the bias condition be set so that the equation (8) is met by properly selecting the number M of diodes, the forward voltage $V_d'$ which depends on the size (area) of each diode.

For example, if $R_f \cdot I_i$ is equal to 0.7 V, the forward voltage $V_d'$ of each bias setting diode 12 is equal to 0.8 V, and the pinch-off voltage $V_p$ of the main FET 1 is equal to 1V, the number M of bias setting diodes 12 should be 2 to satisfy the bias condition requirement associated with the main FET 1. After determining the number M of diodes connected in series, it is possible to adjust the bias condition more finely by adjusting the size (area) of each diode.

In this embodiment, the open loop gain, which can be represented by equation (3), is controlled by reducing the transconductance $g_m$ of the main FET 1 rather than reducing the load resistance R1. Thus, the ability of variable open loop gain control which can work correctly regardless of the power supply voltage is achieved with the simple circuit structure.

Embodiment 3

Figure 3:
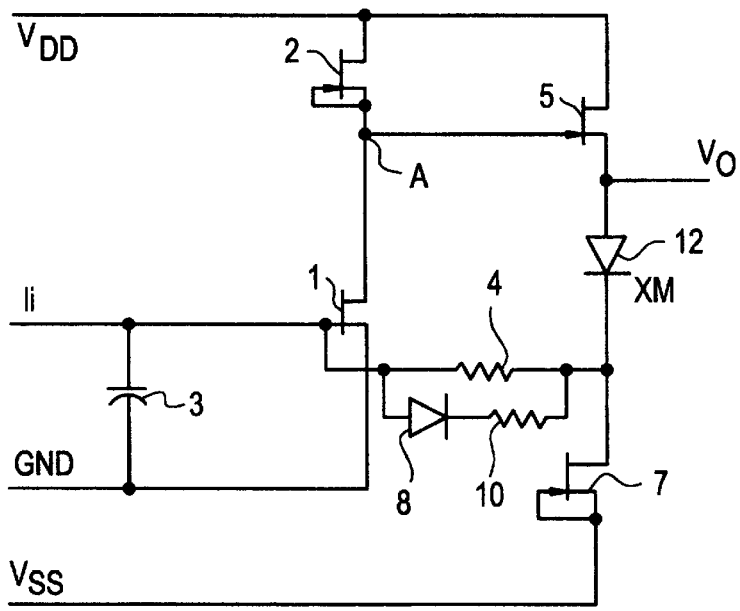
FIG. 3 shows a circuit diagram illustrating a negative feedback preamplifier according to a third embodiment of the present invention.

FIG. 3 is a circuit diagram illustrating a negative feedback preamplifier according to a third embodiment of the present invention.

In FIG. 3, reference numerals similar to those used in FIG. 1 or 2 denote similar parts, and they are not described herein in further detail. As in the first embodiment described above in conjunction with FIG. 1, the negative feedback preamplifier of this third embodiment also includes a series connection of a diode 8 and a resistor 10 which is connected in parallel to the feedback resistor 4 in such a manner that the anode of the diode 8 is connected to the gate of the main FET 1 wherein the diode 8 acts to switch the current-voltage conversion gain when a large signal current is input to the negative feedback preamplifier, and the resistor 10 absorbs the variation in the on-resistance $R_d$ of the diode 8 due to the semiconductor process variations thereby ensuring that the variable conversion gain control works correctly regardless of the semiconductor process variations.

As in the second embodiment shown in FIG. 2, the circuit shown of the present embodiment also includes a series of bias setting diodes 12 whose anode end is connected to the source of the source follower FET 5 wherein the number M of diodes 12 is selected so that when a large signal current is input to the circuit the drain-source voltage $V_d$ of the main FET 1 decreases down to a value smaller than the pinch-off voltage Vp thereby reducing the transconductance $g_m$ of the main FET 1. Thus the circuit, although constructed in a simple fashion, has the capability of variable open loop gain control which can work correctly regardless of the variation in the power supply voltage.

The operation will be described below.

When a large signal current is input to the negative feedback preamplifier, the diode 8 turns on and thus the effective resistance of the feedback resistor 4 becomes low, which results in a reduction in the current-voltage conversion gain. In this way, variable conversion gain control is performed in this circuit. The effective resistance value of the feedback resistor 4 is given, as in the first embodiment, by the parallel resistance of the intrinsic resistance $R_f$ and the series of the resistance $R_f$ of the resistor 10 and the on-resistance $R_d$ of the diode 8.

If the resistance $R_s$ of the resistor 10 is selected such that $R_f >> R_s >> R_d$, then the input-output characteristic is given by equation (5), and thus the variable conversion gain does not depend on the on-resistance of the diode 8.

That is, the additional resistance $R_s$ disposed in series to the diode 8 acts to determine the current-voltage conversion gain in the high input signal condition thereby ensuring that the variable conversion gain control can work correctly regardless of the semiconductor process variations.

When an input signal current $I_i$ is applied to the circuit, the potential at the point A decreases by $V_f + R_s \cdot I_i$. That is, a voltage reduction equal to $V_f + R_s \cdot I_i$ occurs in the drain-source voltage $V_d$ of the main FET 1 due to the input signal current Ii. If the drain-source voltage $V_d$ of the main FET 1 becomes smaller than the pinch-off voltage $V_p$, a reduction occurs in the transconductance $g_m$ of the main FET 1.

Therefore, if the bias is set such that when a large signal current is input to the circuit, the drain-source voltage $V_d$ of the main FET 1 drops down to a level smaller than the pinch-off voltage $V_d$, then the above simple circuit structure has the capability of variable open gain control which can work correctly regardless of the variation in the power supply voltage. The adjustment of the bias associated with the main FET 1 is performed by properly selecting the number of diodes 12 (there are M diodes in the example shown in FIG. 3) and the size of each diode.

If the number of bias setting diodes 12 is denoted by M and the forward voltage of each diode is denoted by $V_d'$, the drain-source voltage $V_d$ of the main FET 1, which is reduced by the amount of $R_f \cdot I_i$, can be represented by equation (6). Furthermore, since the drain-source voltage $V_d$ should be smaller than the pinch-off voltage $V_p$ it is required to meet equation (7). Thus, equation (8) is deduced from the above two equations. In order that the circuit with the simple structure of the present embodiment can correctly performs variable open loop gain control regardless of the power supply voltage, it is required that the bias condition is set such that equation (8) is met.

Since both the variable conversion gain control and the variable open loop gain control should work correctly at the same time for the same input current, the equation $V_p = R_f I_i$ representing the requirement in terms of the turn-on voltage in the variable conversion gain control and the equation $M \cdot V_d' \approx V_d + R_f I_i$ associated with the variable open loop gain control should both be met. Thus, equation (8) should be rewritten as:

$$M \cdot V d' \approx V_p + V_s \qquad (8')$$

The circuit with the above simple structure can obtain the ability of correctly controlling the variable open loop gain regardless of the power supply voltage by properly selecting the number M of diodes and the forward voltage $V_d'$ which depends on the size (area) of each diode so that equation (8') is met.

For example, if the forward voltage $V_d$ of the diode 8 is equal to 0.7 V, the forward voltage $V_d'$ of each bias setting diode 12 is equal to 0.8 V, and the pinch-off voltage $V_p$ of the main FET 1 is equal to 1 V, the number M of bias setting diodes 12 should be 2 so as to satisfy the bias condition requirement associated with the main FET 1. After determining the number M of diodes connected in series, it is possible to adjust the bias condition more finely by adjusting the size (area) of each diode.

Figure 4:
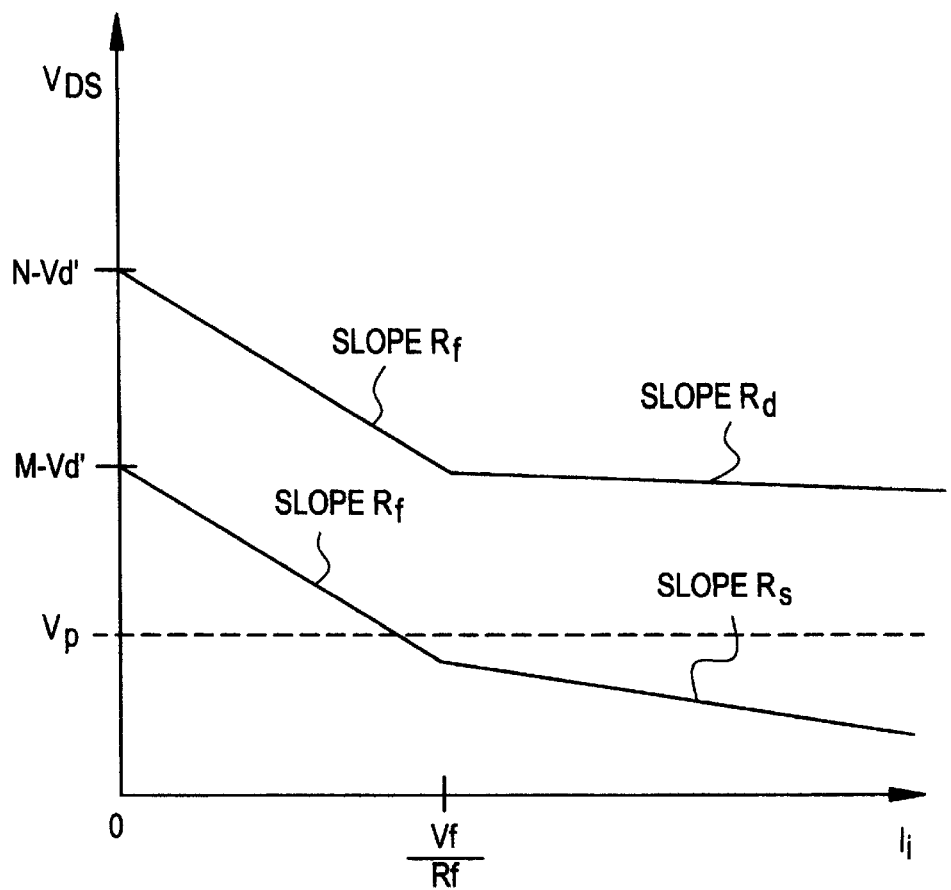
FIG. 4 shows a graph illustrating the characteristic obtained in the third embodiment, wherein the characteristic of a known circuit is also shown for comparison.

FIG. 4 illustrates the characteristic obtained in this third embodiment wherein the characteristic of the conventional circuit shown in FIG. 18 is also shown for comparison.

In FIG. 4, the horizontal axis represents the input signal current $I_i$ and the vertical axis represents the drain-source voltage $V_d$ of the main FET 1. When the input current $I_i$ is within a small range less than $V_d/R_f$, the characteristic curves of both the circuit of the present embodiment and the conventional circuit shown in FIG. 17 exhibit a slope equal to the resistance $R_f$ of the feedback resistor 4.

Figure 17:
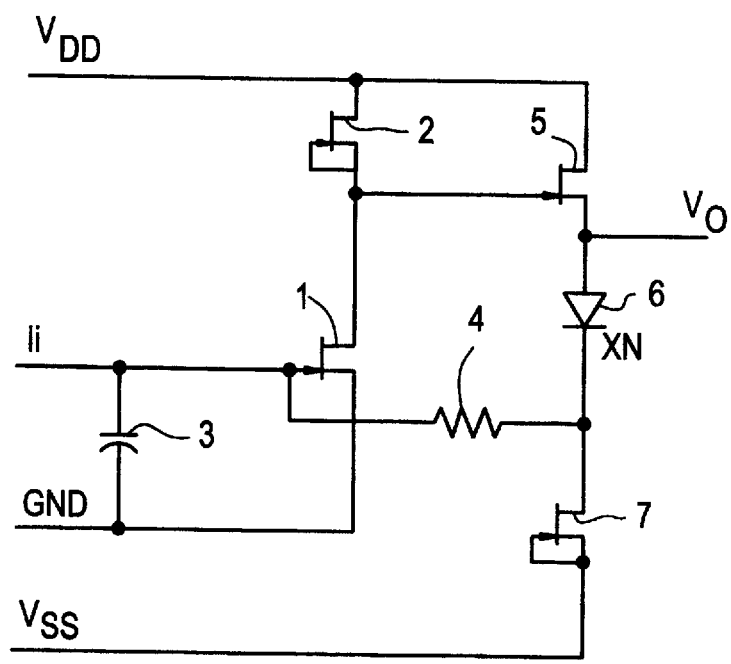
FIG. 17 shows a circuit diagram illustrating a negative feedback preamplifier having no capability of AGC, according to a privately known but unpublished technique.

When the input signal current $I_i$ is given as $I_i \approx V_d/R_f$, although the drain-source voltage $V_d$ of the main FET 1 is greater than the pinch-off voltage $V_p$ in the case of the conventional circuit shown in FIG. 17, the drain-source voltage $V_d$ of the present embodiment is smaller than the pinch-off voltage $V_p$.

Thus, in the circuit of the present embodiment, the drain-source voltage $V_d$ of the main FET 1 becomes smaller than the pinch-off voltage $V_p$ when a large signal input current is applied to the circuit, thereby ensuring that the variable open loop gain is properly controlled with the simple circuit configuration regardless of the power supply voltage.

On the other hand, when the input current $I_i$ is within a large range greater than $V_d/R_f$, the characteristic curve of the circuit according to this third embodiment has a slope equal to the resistance $R_s$ of the resistor 10, as opposed to the conventional circuit shown in FIG. 17 in which the slope is equal to the on-resistance $R_d$ of the diode.

Thus, the circuit of the present embodiment has the ability of the variable conversion gain control which can correctly work regardless of the characteristic variations of the diode 8 due to the semiconductor process variations. As a result, the negative feedback preamplifier of the present embodiment can stably amplify the input signal over the wide range from a low current level to a high current level.

Embodiment 4

Figure 5:
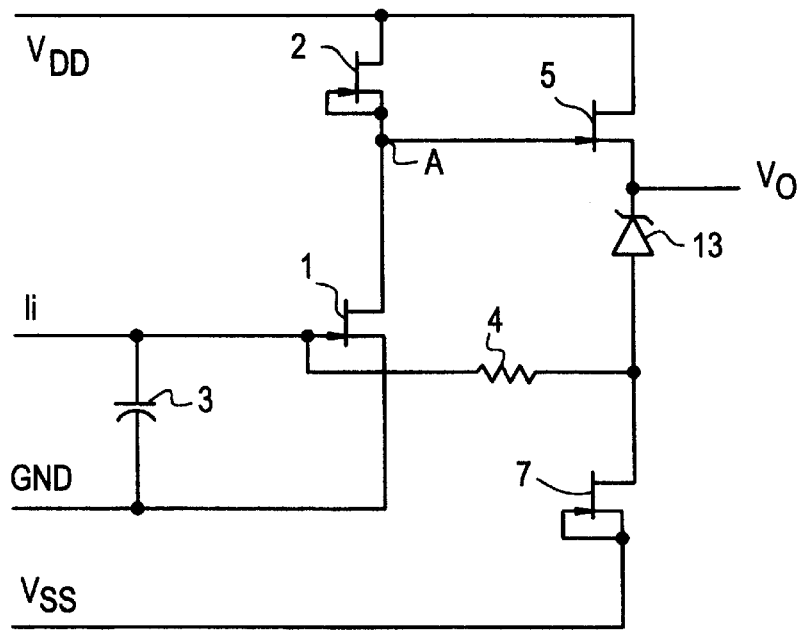
FIG. 5 shows a circuit diagram illustrating a negative feedback preamplifier according to a fourth embodiment of the present invention.

FIG. 5 is a circuit diagram illustrating a negative feedback preamplifier according to a fourth embodiment of the present invention.

In FIG. 5, reference numerals similar to those used in FIG. 2 denote similar parts, and they are not described herein in further detail. The circuit shown in FIG. 5 is different from that shown in FIG. 2 in that, instead of employing the bias setting diodes 12, the bias setting portion is realized using a Zener diode 13.

When a large signal current is input to the circuit, the Zener diode 13 acts to reduce the drain-source voltage $V_d$ of the main FET 1 down to a value equal to or smaller than the pinch-off voltage $V_p$ thereby reducing the transconductance gm of the main FET 1.

Thus the present embodiment provide the capability of variable open loop gain control which can correctly work with the simple circuit configuration regardless of the power supply voltage.

Now, the operation will be described below.

The following description mainly deals with the difference from the second embodiment described above. By means of a constant-current source FET 7 which is an element of a source follower circuit, a constant current is always passed through the Zener diode 13.

Therefore, it is possible to adjust the bias of the main FET 1 by properly selecting the parameters of the Zener diode 13 so that the circuit, although constructed in a simple form, has the ability of variable open loop gain control which can correctly work regardless of the variation in the power supply voltage.

As in the third embodiment, the technique of the fourth embodiment may be combined with the technique of the first embodiment so that the negative feedback preamplifier can stably amplify the input signal over the wide range from a low current level to a high current level.

Embodiment 5

Figure 6:
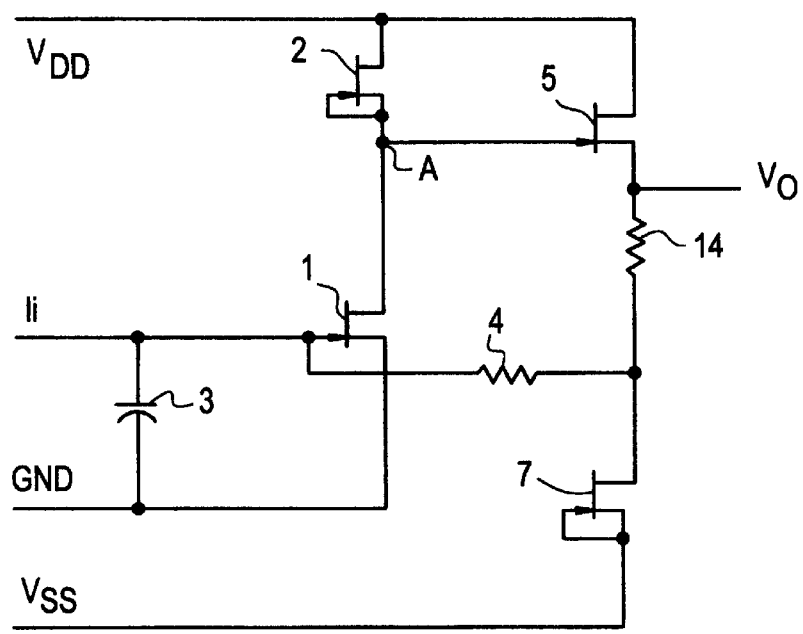
FIG. 6 shows a circuit diagram illustrating a negative feedback preamplifier according to a fifth embodiment of the present invention.

FIG. 6 is a circuit diagram illustrating a negative feedback preamplifier according to a fifth embodiment of the present invention.

In FIG. 6, reference numerals similar to those used in the second embodiment shown in FIG. 2 denote similar parts, and they are not described herein in further detail. The difference from the circuit shown in FIG. 2 is that, instead of employing the bias setting diodes 12, the bias setting portion is realized using a resistor 14.

When a large signal current is input to the circuit, the resistor 14 acts to reduce the drain-source voltage $V_d$ of the main FET 1 down to a value equal to or smaller than the pinch-off voltage $V_p$ thereby reducing the transconductance gm of the main FET 1.

Thus the present embodiment provide the capability of variable open loop gain control which can correctly work with the simple circuit configuration regardless of the power supply voltage.

Now, the operation will be described below.

The following description mainly deals with the difference from the second embodiment described above. By means of a constant-current source FET 7 which is one element of a source follower circuit, a constant current is always passed through the resistor 14.

Therefore, it is possible to adjust the bias of the main FET 1 by properly selecting the resistance value of the resistor 14 so that the circuit, although constructed in a simple form, has the ability of variable open loop gain control which can correctly work regardless of the variation in the power supply voltage.

As in the third embodiment, the technique of this fifth embodiment may be combined with the technique of the first embodiment so that the negative feedback preamplifier can stably amplify the input signal over the wide range from a low current level to a high current level.

Embodiment 6

Figure 7:
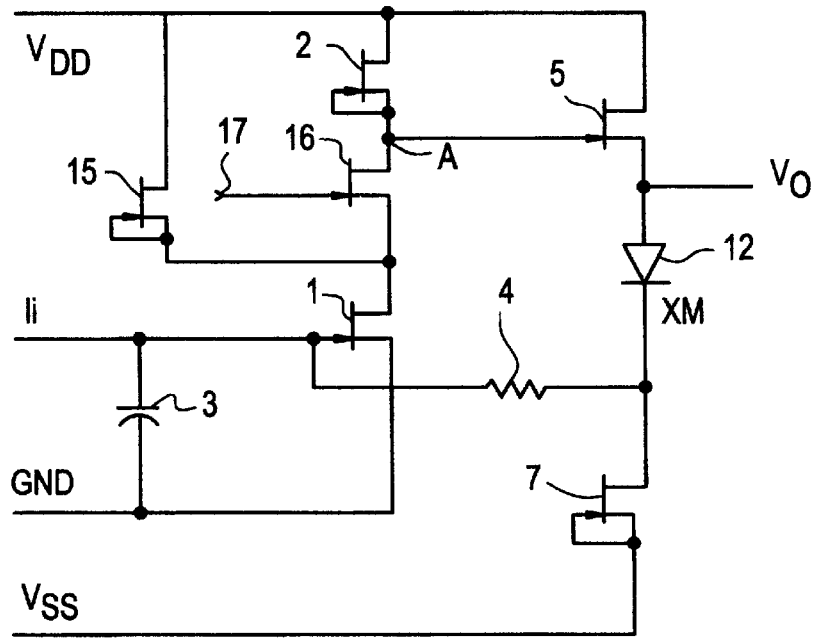
FIG. 7 shows a circuit diagram illustrating a negative feedback preamplifier according to a sixth embodiment of the present invention.

FIG. 7 is a circuit diagram illustrating a negative feedback preamplifier according to a sixth embodiment of the present invention.

In FIG. 7, reference numerals similar to those used in the second embodiment shown in FIG. 2 denote similar parts, and they are not described herein in further detail. In this sixth embodiment, unlike the second embodiment, there are provided additional FETs 15 and 16. The FET 15 serves as a current injection FET, wherein the drain thereof is connected to the power supply voltage $V_{DD}$, and the gate and source are connected to each other and further connected to the drain of the main FET 1.

The FET 16 serves as a cascode connection FET which is disposed between the main FET 1 and the load FET 2 in such a manner that the drain of the FET 16 is connected to the source of the load FET 2, the source is connected to the drain of the main FET 1, and the gate is connected to the constant-current source 17. These additional FETs in conjunction with the main FET 1 and the load FET 2 form a current injection type grounded source amplifier.

The circuit also includes a series of bias setting diodes 12 similar to that employed in the circuit shown in FIG. 2 whereby the bias is controlled such that the drain-source voltage $V_d$ of the cascode connection FET 16 becomes lower than the pinch-off voltage $V_p$ when a large signal current is input to the circuit.

Thus, the negative feedback preamplifier with the simple circuit configuration according to the present embodiment has the capability of variable open loop gain control which can correctly work regardless of the variation in the power supply voltage.

Now, the operation will be described below.

In this sixth embodiment, the invention is applied to the current injection type grounded source amplifier. The current injection type grounded source amplifier refers to an amplifier in which a DC bias current is supplied to the main FET 1 from the current injection constant source FET 15 thereby allowing a reduction in the size of the load FET 2 and thus an increase in the load resistance, which leads to an increased open loop gain. The open loop gain is given by:

$$A = R_1 \cdot g_{m1} \cdot [R_c/(R_0 + 1/g_{m2})] \tag{9}$$

where $R_0$ is the AC resistance of the current injection FET 15, $R_1$ is the AC resistance of the load FET 2, $g_{m1}$ is the transconductance of the main FET 1, and the $g_{m2}$ is the transconductance of the cascode connection FET 16.

From the equation, it can be seen that the open loop gain can be reduced by reducing the transconductance $g_{m2}$ of the cascode connection FET 16. When an input signal current $I_i$ is applied to the amplifier, the potential at point A in FIG. 7 decreases by $R_f \cdot I_i$, while the potential of the source of the cascode connection FET 16 remains substantially unchanged at the level equal to the gate potential.

As a result, the drain-source voltage $V_d$ of the cascode connection FET 16 decreases by $R_f \cdot I_i$. Since the transconductance $g_{m2}$ of the cascode connection FET 16 decreases when its drain-source voltage $V_d$ drops down to a level less than the pinch-off voltage $V_p$, it is possible to achieve the ability of controlling the variable open loop gain with a simple circuit configuration by setting the bias condition such that the source-drain voltage $V_d$ of the cascode connection FET 16 becomes less than the pinch-off voltage $V_p$ when a large signal current is input to the circuit.

The setting of the bias associated with the cascode connection FET 16 is performed, as in the case of the second embodiment, by properly selecting the number of diodes 12 (there are M diodes in the example shown in FIG. 7) and the size of each diode, and/or by adjusting the cascode voltage (the voltage at the gate of the cascode connection FET 16).

The drain-source voltage $V_d$ of the cascade connection FET 16 is reduced by a magnitude of $R_f \cdot I_i$ due to an input signal current $I_i$, and thus the drain-source voltage $V_d$ is given as:

$$V_d = (M \cdot V_d' - V_e) - R_f I_i \tag{10}$$

where M is the number of bias setting diodes 12 connected in series, $V_d'$ is the forward voltage of each bias setting diodes 12, and $V_e$ is the cascode voltage.

Since the drain-source voltage $V_d$ is required to be less than the pinch-off voltage $V_p$, the following equation (11) should be met.

$$V_d \leq V_p \tag{11}$$

From the above equations, the following equation (12) is deduced.

$$(M \cdot V_d' - V_e) \approx V_p + V_f \tag{12}$$

In order that the above circuit with the simple structure can work correctly in terms of the variable open loop gain control regardless of the variation in the power supply voltage, it is required that the bias condition is set so that the equation (12) is met by properly selecting the number M of diodes, the forward voltage $V_d'$ which depends on the size (area) of each diode, and the cascode voltage $V_c$.

As in the third embodiment, the technique of the sixth embodiment may be combined with the technique of the first embodiment so that the negative feedback preamplifier can stably amplify the input signal over the wide range from a low current level to a high current level.

Embodiment 7

Figure 8:
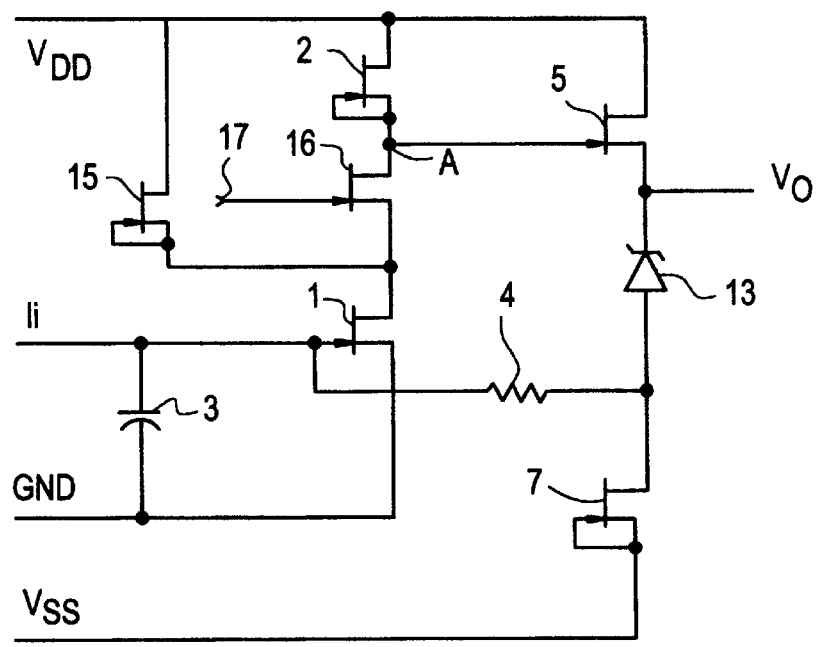
FIG. 8 shows a circuit diagram illustrating a negative feedback preamplifier according to a seventh embodiment of the present invention.

FIG. 8 is a circuit diagram illustrating a negative feedback preamplifier according to a seventh embodiment of the present invention. In FIG. 8, similar parts to those in the sixth embodiment shown in FIG. 7 are denoted by similar reference numerals, and they are not described herein in further detail.

The difference between the circuit shown in FIG. 8 and that shown in FIG. 7 is that, instead of employing the bias setting diodes 12, the bias setting portion is realized using a Zener diode 13. When a large signal current is input to the circuit, the Zener diode 13 acts to reduce the drain-source voltage $V_d$ of the cascode connection FET 16 down to a value equal to or smaller than the pinch-off voltage $V_p$ thereby reducing the transconductance $g_m$ of the cascode connection FET 16.

Thus, although the preamplifier of present embodiment is constructed in the simple circuit form, it has the capability of variable open loop gain control which can correctly work regardless of the power supply voltage.

The operation will be described below.

The following description mainly deals with the difference from the sixth embodiment described above. The constant-current source FET 7 which is one element of the source follower circuit allows the Zener diode 13 to always have a constant current flowing through it.

Therefore, it is possible to adjust the bias condition associated with the cascode connection FET 16 by adjusting the parameters of the Zener diode 13 so that the circuit constructed in the simple form has the ability of variable open loop gain control which can correctly work regardless of the variation in the power supply voltage.

As in the third embodiment, the technique of this seventh embodiment may be combined with the technique of the first embodiment so that the negative feedback preamplifier can stably amplify the input signal over the wide range from a low current level to a high current level.

Embodiment 8

Figure 9:
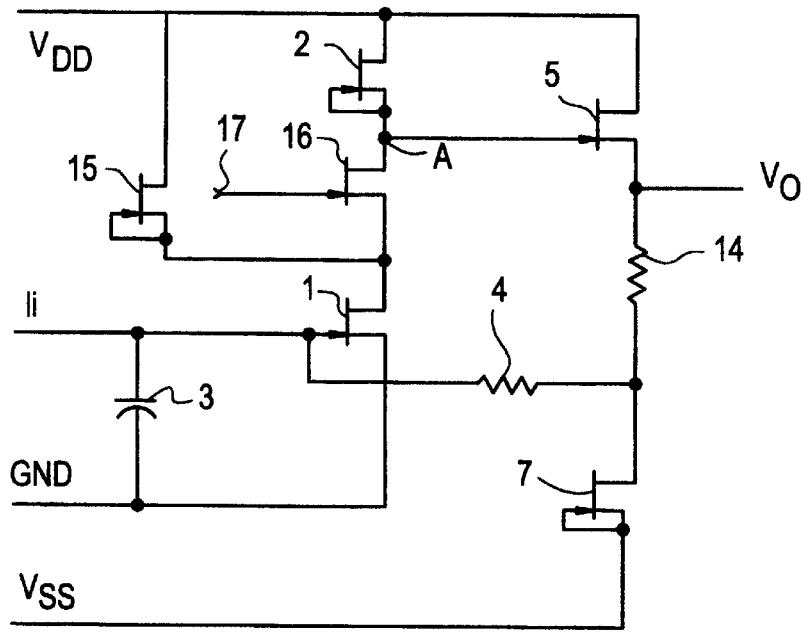
FIG. 9 shows a circuit diagram illustrating a negative feedback preamplifier according to an eighth embodiment of the present invention.

FIG. 9 is a circuit diagram illustrating a negative feedback preamplifier according to an eighth embodiment of the present invention.

In FIG. 9, similar parts to those in the sixth embodiment shown in FIG. 7 are denoted by similar reference numerals, and they are not described herein in further detail. The difference from the circuit shown in FIG. 7 is that, instead of employing the bias setting diodes 12, the bias setting portion is realized using a resistor 14.

When a large signal current is input to the circuit, the resistor 14 acts to reduce the drain-source voltage $V_d$ of the cascode connection FET 16 down to a value equal to or smaller than the pinch-off voltage $V_p$ thereby reducing the transconductance $g_{m2}$ of the cascode connection FET 16. Thus, the circuit, although constructed in a simple form, has the capability of variable open loop gain control which can correctly work regardless of the power supply voltage.

Now, the operation will be described below.

The following description mainly deals with the difference from the sixth embodiment described above. The constant-current source FET 7, which is one of the elements of the source follower circuit, allows the resistor 14 to always have a constant current flowing through it.

Therefore, it is possible to adjust the bias condition associated with the cascode connection FET 16 by adjusting the resistance of the resistor 14 so that the circuit, although constructed in the simple form, has the ability of variable open loop gain control which can correctly work regardless of the variation in the power supply voltage.

As in the third embodiment, the technique of this eighth embodiment may be combined with the technique of the first embodiment so that the negative feedback preamplifier can stably amplify the input signal over the wide range from a low current level to a high current level.

Embodiment 9

Figure 10:
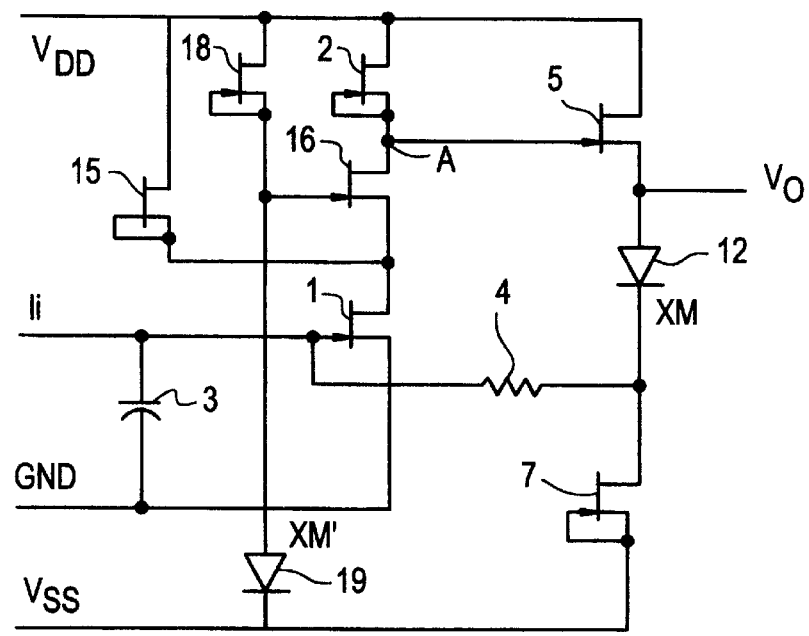
FIG. 10 shows a circuit diagram illustrating a negative feedback preamplifier according to a ninth embodiment of the present invention.

FIG. 10 is a circuit diagram illustrating a negative feedback preamplifier according to a ninth embodiment of the present invention.

In FIG. 10, similar parts to those of the sixth embodiment shown in FIG. 7 are denoted by similar reference numerals, and they are not described herein in further detail. The difference from the sixth embodiment is that there is provided an additional constant voltage power supply circuit by which the gate of the cascode connection FET 16 is maintained at a particular voltage wherein the constant-voltage source is composed of: a constant-current source FET 18 whose drain is connected to the power supply voltage $V_{DD}$ and whose gate and source are connected to each other and further to the gate of the cascode connection FET 16; and a gate voltage setting portion composed of a series of a plurality of diodes 19 (there are M' diodes in the example shown in FIG. 10) which is disposed between the constant-current source FET 18 and the power supply voltage $V_{SS}$ in such a manner that the anode end of the series of diodes 19 is connected to the source of the constant-current source FET 18.

Now, the operation will be described below.

The following description mainly deals with the difference from the sixth embodiment described above. Since the gate voltage of the cascode connection FET 16 is nearly equal to the source voltage, the drain-source voltage $V_d$ of the cascade connection FET 16 may be controlled by adjusting the gate voltage while maintaining the drain at a constant voltage. By means of the constant-current source FET 18, a constant current is always passed through the series of diodes 19.

Therefore, the voltage of the gate of the cascode connection FET 16 can be adjusted by properly selecting the number of diodes 19 and/or the size of each diode so that the drain-source voltage Vds is properly biased. Thus, the circuit has the ability of variable open loop gain control which can correctly work regardless of the variation in the power supply voltage.

The bias setting diodes 12 may be replaced by a Zener diode 13 as in the seventh embodiment to achieve the capability of the variable open loop gain which can work correctly with a simple circuit configuration regardless of the variation in the power supply voltage.

Alternatively, a resistor 14 may be employed instead of the bias setting diodes 12 as in the eighth embodiment to achieve the capability of the variable open loop gain which can also work correctly with a simple circuit configuration regardless of the variation in the power supply voltage.

Furthermore, as in the third embodiment, the technique of this ninth embodiment may be combined with the technique of the first embodiment so that the negative feedback preamplifier can stably amplify the input signal over the wide range from a low current level to a high current level.

Embodiment 10

Figure 11:
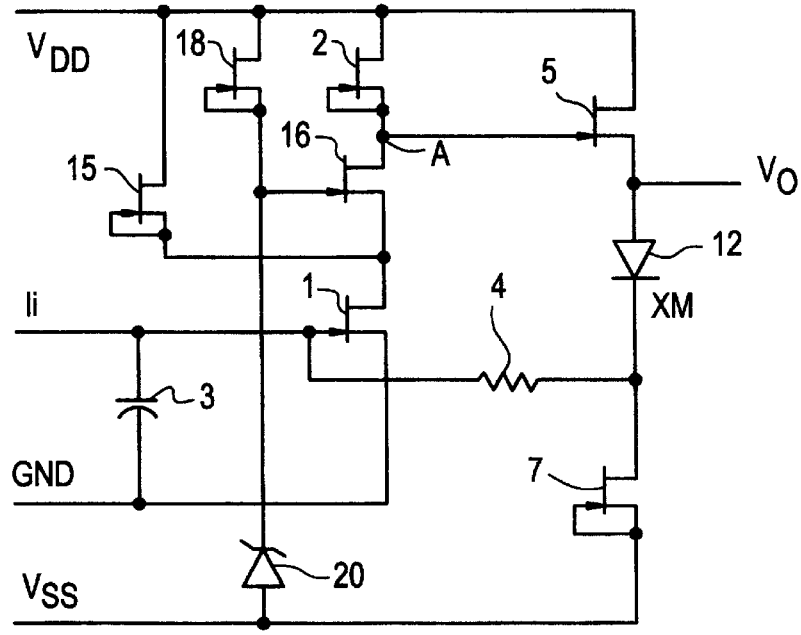
FIG. 11 shows a circuit diagram illustrating a negative feedback preamplifier according to a tenth embodiment of the present invention.

FIG. 11 is a circuit diagram illustrating a negative feedback preamplifier according to a tenth embodiment of the present invention.

In FIG. 11, similar parts to those of the ninth embodiment shown in FIG. 10 are denoted by similar reference numerals, and they are not described herein in further detail. The difference from the ninth embodiment is that the series of diodes 19 serving as the gate voltage setting portion for controlling the voltage of the gate of the cascode connection FET 16 is replaced by a Zener diode 20.

Now, the operation will be described below.

The following description mainly deals with the difference from the ninth embodiment described above. By means of the constant-current source FET 18, a constant current is always passed through the Zener diode 20. Therefore, the drain-source voltage $V_d$ of the cascode connection FET 16 can be adjusted by properly selecting the parameters of the Zener diode 20 so that the circuit constructed in the simple manner has the ability of variable open loop gain control which can correctly work regardless of the variation in the power supply voltage.

The diodes 12 may be replaced by a Zener diode 13 as in the seventh embodiment to achieve the capability of the variable open loop gain which can work correctly with a simple circuit configuration regardless of the variation in the power supply voltage.

Alternatively, a resistor 14 may be employed instead of the diodes 12, as in the eighth embodiment, to achieve the capability of the variable open loop gain which can also work correctly with a simple circuit configuration regardless of the variation in the power supply voltage.

Furthermore, as in the third embodiment, the technique of this tenth embodiment may be combined with the technique of the first embodiment so that the negative feedback preamplifier can stably amplify the input signal over the wide range from a low current level to a high current level.
Embodiment 11

Figure 12:
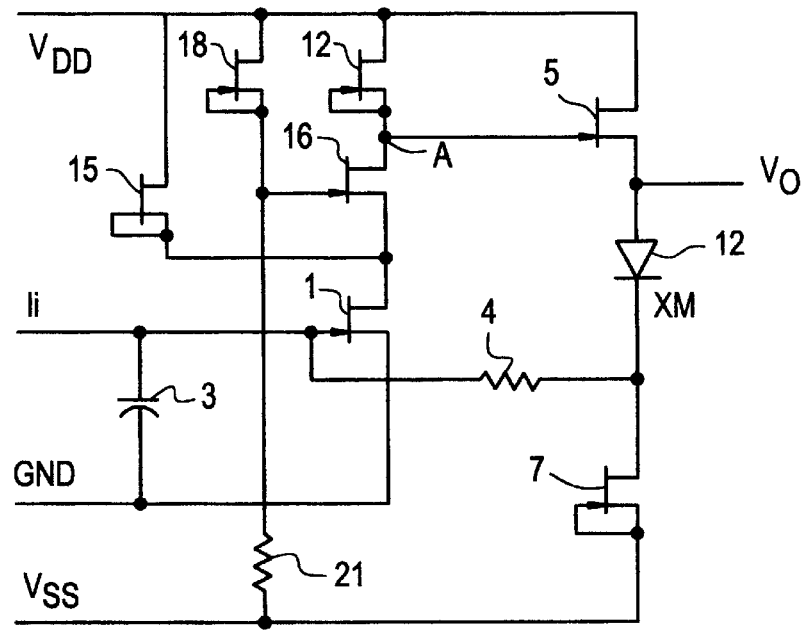
FIG. 12 shows a circuit diagram illustrating a negative feedback preamplifier according to an eleventh embodiment of the present invention.

FIG. 12 is a circuit diagram illustrating a negative feedback preamplifier according to an eleventh embodiment.

In FIG. 11, similar parts to those of the ninth embodiment shown in FIG. 10 are denoted by similar reference numerals, and they are not described herein in further detail. The difference from the ninth embodiment is that the series of diodes 19 serving as the gate voltage setting portion for setting the voltage of the gate of the cascode connection FET 16 is replaced by a resistor 21.

The operation will be described below.

The following description mainly deals with the difference from the ninth embodiment described above. By means of the constant-current source FET 18, a constant current is always passed through the resistor 21. Therefore, the drain-source voltage $V_d$ of the cascode connection FET 16 can be adjusted by properly selecting the resistance of the resistor 21 so that the circuit, although constructed in a simple fashion, has the ability of variable open loop gain control which can correctly work regardless of the variation in the power supply voltage.

The bias setting diodes 12 may be replaced by a Zener diode 13 as in the seventh embodiment to achieve the capability of the variable open loop gain which can work correctly with a simple circuit configuration regardless of the variation in the power supply voltage.

Alternatively, a resistor 14 may be employed instead of the bias setting diodes 12, as in the eighth embodiment, to achieve the capability of the variable open loop gain which can also work correctly with a simple circuit configuration regardless of the variation in the power supply voltage.

Furthermore, as in the third embodiment, the technique of this eleventh embodiment may be combined with the technique of the first embodiment so that the negative feedback preamplifier can stably amplify the input signal over the wide range from a low current level to a high current level.
Embodiment 12

Figure 13:
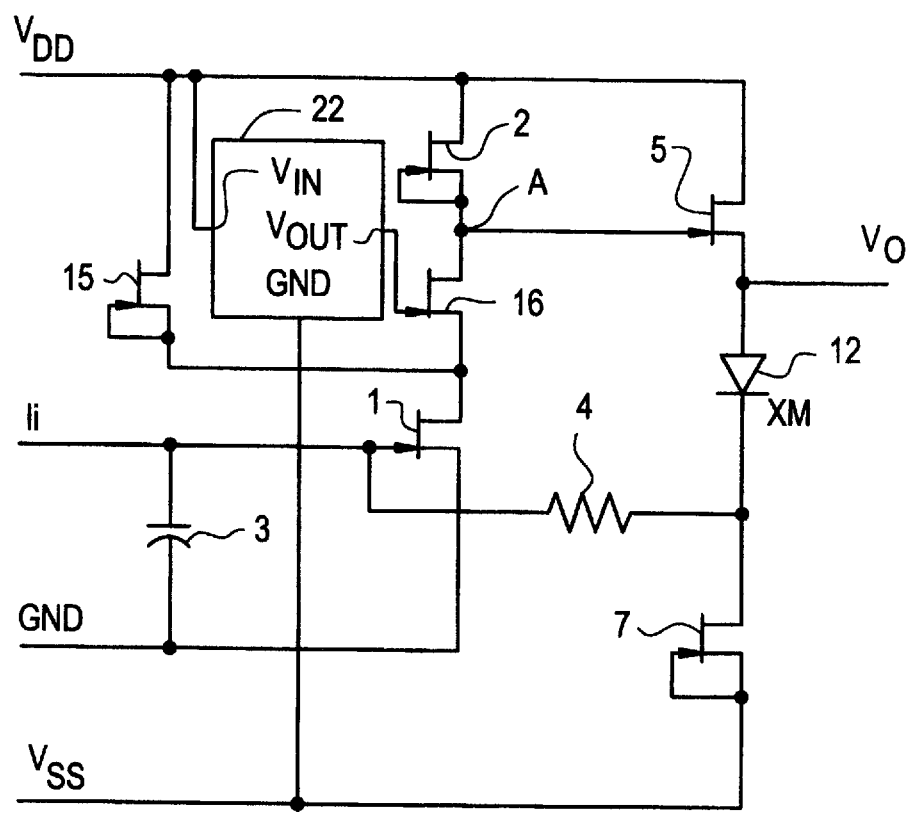
FIG. 13 shows a circuit diagram illustrating a negative feedback preamplifier according to a twelfth embodiment of the present invention.

FIG. 13 is a circuit diagram illustrating a negative feedback preamplifier according to a twelfth embodiment of the present invention.

In FIG. 13, similar parts to those of the ninth embodiment shown in FIG. 10 are denoted by similar reference numerals, and they are not described herein in further detail. The difference from the ninth embodiment is that a regulator 22 is employed as a constant voltage power supply circuit serving as bias control means for maintaining the gate of the cascode connection FET 16 at a particular voltage.

Now, the operation will be described below.

The following description mainly deals with the difference from the ninth embodiment described above. It is possible to set the bias condition associated with the drain-source voltage $V_d$ of the cascode connection FET 16 by properly selecting the characteristic parameters of the regulator 22 so that the circuit, although constructed in a simple fashion, has the ability of variable open loop gain control which can correctly work regardless of the variation in the power supply voltage.

The bias setting diodes 12 may be replaced by a Zener diode 13 as in the seventh embodiment to achieve the capability of the variable open loop gain which can work correctly with a simple circuit configuration regardless of the variation in the power supply voltage.

Alternatively, a resistor 14 may be employed instead of the diodes 12, as in the eighth embodiment, to achieve the capability of the variable open loop gain which can also work correctly with a simple circuit configuration regardless of the variation in the power supply voltage.

Furthermore, as in the third embodiment, the technique of this ninth embodiment may be combined with the technique of the first embodiment so that the negative feedback preamplifier can stably amplify the input signal over the wide range from a low current level to a high current level.
Embodiment 13

Figure 14:
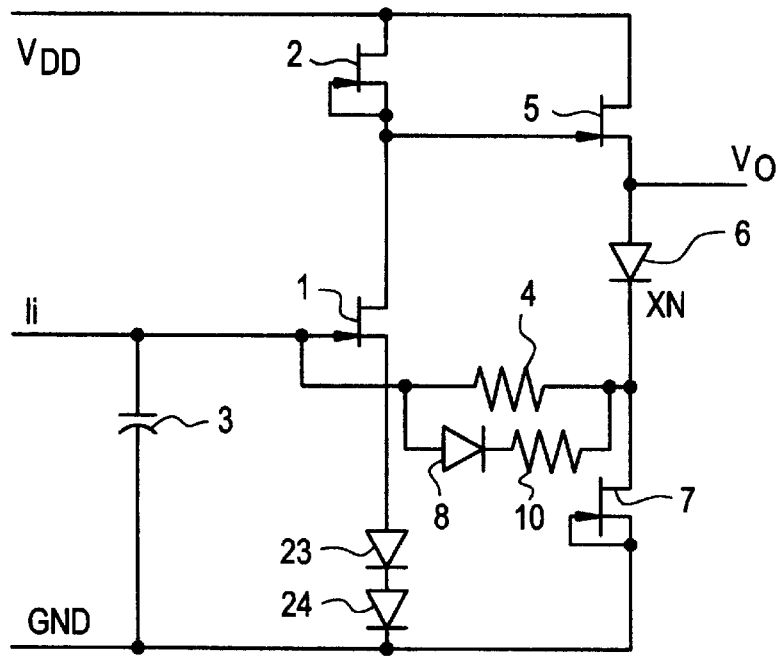
FIG. 14 shows a circuit diagram illustrating a negative feedback preamplifier according to a thirteenth embodiment of the present invention.

FIG. 14 is a circuit diagram illustrating a negative feedback preamplifier according to a thirteenth embodiment of the present invention.

In FIG. 14, similar parts to those in the first embodiment shown in FIG. 1 are denoted by similar reference numerals, and they are not described herein in further detail. The difference from the first embodiment is that there is an additional source voltage control circuit disposed between the source of the main FET 1 and ground.

The source voltage setting portion is composed of a plurality (two, for example) of diodes 23 and 24 connected in series wherein the anode end of the series of diodes is connected to the source of the main FET 1 and the cathode end is grounded. The source voltage setting portion provides a constant voltage (for example 1.4 V) between the source of the main FET 1 and ground, corresponding to the $V_{SS}$-to-GND voltage in the first embodiments. In this circuit configuration, the negative power supply $V_{SS}$ employed in the first embodiment is no longer needed and thus the circuit can operate with a single power supply.
Embodiment 14

Figure 15:
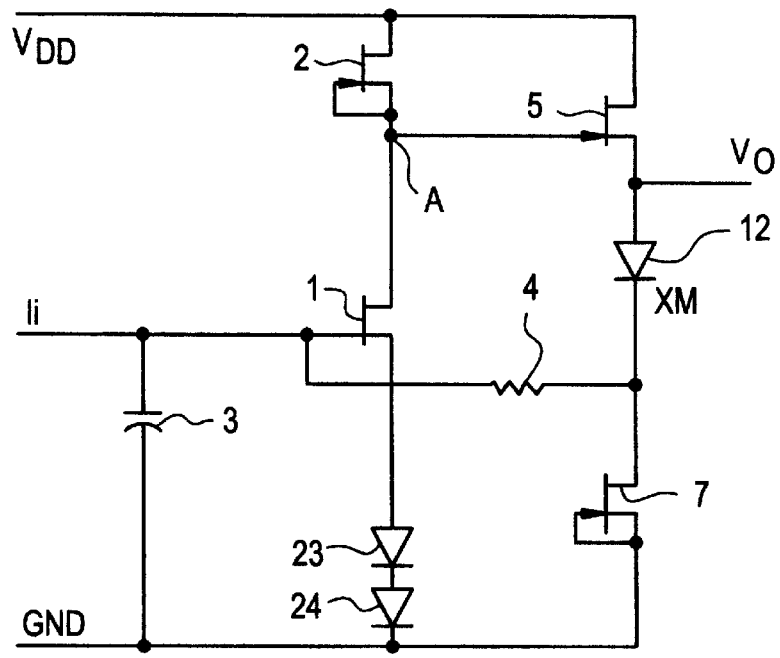
FIG. 15 shows a circuit diagram illustrating a negative feedback preamplifier according to a fourteenth embodiment of the present invention.

FIG. 15 is a circuit diagram illustrating a negative feedback preamplifier according to a fourteenth embodiment of the present invention.

This circuit shown in FIG. 15 is based on the circuit according to the second embodiment shown in FIG. 2, and operates in a similar manner to the second embodiment. However, as opposed to the second embodiment, there is an additional source voltage setting portion composed of diodes 23 and 24 similar to that employed in the thirteenth embodiment shown in FIG. 14 whereby the circuit can operate with only a single power supply.
Embodiment 15

Figure 16A:
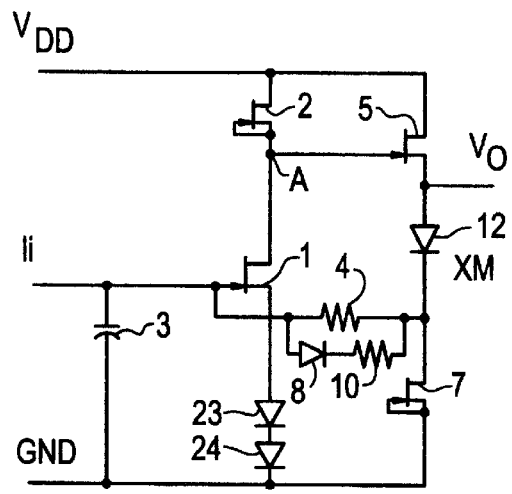
FIGS. 16A to 16C each show a circuit diagram illustrating a negative feedback preamplifier according to a fifteenth embodiment of the present invention.
Figure 16B:
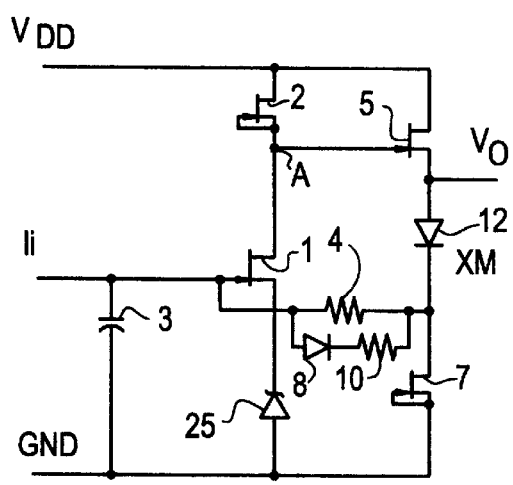
Figure 16C:
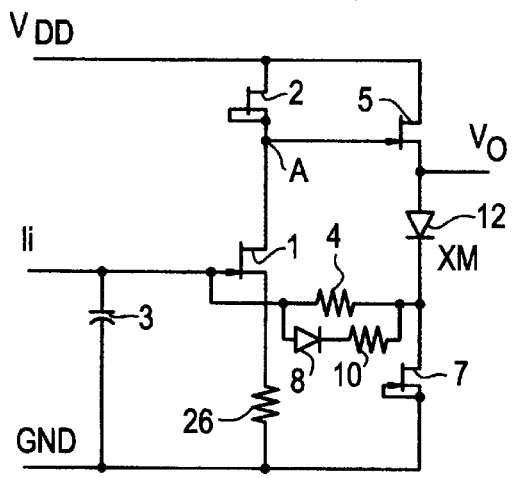

FIGS. 16A to 16C each show a circuit diagram illustrating a negative feedback preamplifier according to a fifteenth embodiment of the present invention.

This circuit shown in FIG. 16A is based on the circuit according to the third embodiment shown in FIG. 3, and operates in a similar manner to the third embodiment. However, as opposed to the third embodiment, there is an additional source voltage setting portion composed of diodes 23 and 24 similar to that employed in the thirteenth embodiment shown in FIG. 14 whereby the circuit can operate with only a single power supply.

In the thirteenth through fifteenth embodiments described above, although the source voltage setting portion is composed of a plurality of diodes connected in a series fashion, the source voltage setting portion may also be composed of a Zener diode 25 wherein the cathode of the Zener diode is connected to the source of the main FET 1 and the anode of the Zener diode is grounded as shown in FIG. 16B. Alternatively, the source voltage setting portion may also be realized with a resistor 26 disposed between the source of the main FET 1 and ground as shown in FIG. 16C.

In the thirteenth through fifteenth embodiments described above, the positive power supply $V_DD$ having a positive voltage (5V) relative to GND (0 V) is employed. Instead, the power supply line $V_{DD}$ may be grounded and the GND line may be connected to a negative power supply (−5.2 V for example).

What is essential in terms of the power supply is that a specified voltage is applied between the drain of the load FET 2 and the cathode of the diode 23, that is, between the two ends of the common-source amplifier.

As described above, the present invention can provide a negative feedback preamplifier having various features and advantages. More specifically, in one aspect of the present invention there is provided a negative feedback preamplifier comprising: a grounded source amplifier including a main FET and a load FET, the source of the main FET being grounded, the drain of the load FET being connected to a positive power supply, the source of the load FET being connected to the drain of the main FET, the gate and the source of the load FET being connected to each other; a source follower circuit including: a source follower FET whose drain is connected to the positive power supply and whose gate is connected to the source of the load FET and whose source serves to provide an output; a bias setting portion connected to the source of the source follower FET, for setting the bias associated with the main FET; and a constant-current source FET whose drain is connected to the other terminal of the bias setting portion, and whose gate and source are connected to each other and further connected to a negative power supply with a voltage lower than that of the positive power supply; a feedback resistor connected between the gate of the main FET and the drain of the constant-current source FET, the feedback resistor serving to determine the current-voltage conversion gain when a small signal current is input to the negative feedback preamplifier; and a series connection of a diode and a resistor which is connected in parallel to the feedback resistor in such a manner that the anode of the diode is connected to the gate of the main FET wherein when a large signal current is input to the negative feedback preamplifier, the current-voltage conversion gain is switched by the diode and the current-voltage conversion gain is determined by the resistor.

In this circuit configuration, the diode, which acts to switch the current-voltage conversion gain when the large signal current is input to the circuit, is connected in series to the resistor so that the variable conversion gain is correctly controlled regardless of the variations associated with the above diode caused by semiconductor process variations.

Further, in the above negative feedback preamplifier, the bias setting portion sets the bias condition so that when a large signal current is input to the negative feedback amplifier, the drain-source voltage of the main FET becomes equal to or smaller than the pinch-off voltage thereby reducing the transconductance of the main FET.

In this circuit configuration, the diode, which acts to switch the current-voltage conversion gain when a large signal current is input to the circuit, is connected gain is correctly controlled regardless of the variations associated with the above diode caused by semiconductor process variations. Furthermore, in this circuit configuration, when a large signal current is applied to the circuit, the transconductance is reduced instead of reducing the load resistance. Thus the circuit, although constructed in the simple fashion, has the capability of variable open loop gain control which can work correctly regardless of the variation in the power supply voltage.

Furthermore, in the above negative feedback preamplifier, the bias setting portion is comprised of a plurality of bias setting diodes connected in series, the anode end of the series of bias setting diodes being connected to the source of the source follower FET, the number of bias setting diodes being selected so that when a large signal current is input to the negative feedback preamplifier the drain-source voltage of the main FET becomes equal to or smaller than the pinch-off voltage thereby reducing the transconductance of the main FET.

In this circuit configuration, the bias condition associated with the main FET can be adjusted by properly selecting the number of diodes or the size of each diode. Thus the circuit, although constructed in the simple fashion, has the ability to correctly and variably control the open loop gain regardless of the variation in the power supply voltage.

Moreover, in the above negative feedback preamplifier, the bias setting portion is composed of a Zener diode whose cathode is connected to the source of the source follower FET, the Zener voltage of the Zener diode being selected so that when a large signal current is input to the negative feedback preamplifier the drain-source voltage of the main FET becomes equal to or smaller than the pinch-off voltage thereby reducing the transconductance of the main FET.

In this circuit configuration, the bias condition associated with the main FET can be adjusted by properly selecting the number of diodes or the size of each diode. Thus the circuit, although constructed in the simple fashion, has the capability of variable open loop gain control which can work correctly regardless of the variation in the power supply voltage.

Still further, in the above negative feedback preamplifier, the bias setting portion is composed of a resistor having a resistance value selected so that when a large signal current is input to the negative feedback preamplifier the drain-source voltage of the main FET becomes equal to or smaller than the pinch-off voltage thereby reducing the transconductance of the main FET.

In this circuit configuration, the bias condition associated with the main FET can be adjusted by properly selecting the resistance of the resistor. Thus the circuit, although constructed in the simple fashion, has the ability to correctly and variably control the open loop gain regardless of the variation in the power supply voltage.

Furthermore, the grounded source amplifier further includes: a current injection FET whose gate and source are connected to each other and further connected to the drain of the main FET so that a DC bias current is provided into the main FET; and a cascode connection FET disposed between the main FET and the load FET, the drain of the cascode connection FET being connected to the source of the load FET, the source of the cascode connection FET being connected to the drain of the main FET, the gate of the cascode connection FET being connected to a constant-voltage source, whereby the grounded source amplifier operates as a current injection type grounded source amplifier; and the bias setting portion sets the bias condition in such a manner that when a large signal current is input to the negative feedback amplifier the drain-source voltage of the cascode connection FET becomes equal to or smaller than the pinch-off voltage.

In this circuit configuration, a DC bias current is supplied to the main FET from the current injection FET thereby allowing a reduction in the size of the load FET and thus an increase in the load resistance, which leads to an increased open loop gain. Furthermore, in this circuit configuration, when a large input signal current is applied to the circuit, the drain-source voltage of the current injection FET is biased to a value less than the pinch-off voltage, and thus the circuit, although constructed in the simple form, has the capability of variable open loop gain control which can correctly work regardless of the variation in the power supply voltage.

Moreover the negative feedback preamplifier is further comprise a constant voltage power supply circuit for setting the gate voltage of the cascode connection FET.

Thus the circuit, although constructed in the simple form, has the capability of variable open loop gain control which can correctly work regardless of the variation in the power supply voltage.

Still further the constant voltage power supply circuit is composed of: a gate voltage setting constant-current source FET whose gate and source are connected to each other and further connected to the gate of the cascode connection FET; and a gate voltage setting portion for setting the gate voltage of the cascode connection FET.

In this circuit configuration, the gate voltage is adjusted by the gate voltage setting portion so that the drain-source voltage is properly biased. Thus the circuit, although constructed in the simple form, has the capability of variable open loop gain control which can correctly work regardless of the variation in the power supply voltage.

Further, the gate voltage setting portion is composed of a plurality of diodes connected in series, the anode end of the series of the diodes being connected to the source of the gate voltage control constant-current source FET.

In this circuit configuration, the gate voltage is adjusted by properly selecting the number of diodes or the size of each diode so that the drain-source voltage is properly biased. Thus the circuit, although constructed in the simple form, has the ability of variable open loop gain control which can correctly work regardless of the variation in the power supply voltage.

Furthermore, the gate voltage setting portion is a Zener diode whose cathode is connected to the source of the gate voltage setting constant-current source FET.

In this circuit configuration, the gate voltage is adjusted by properly selecting the parameters of the Zener diode so that the drain-source voltage is properly biased. Thus the circuit, although constructed in the simple form, has the ability of variable open loop gain control which can correctly work regardless of the variation in the power supply voltage.

Moreover, gate voltage setting portion is a resistor.

In this circuit configuration, the gate voltage is adjusted by properly selecting the resistance of the resistor so that the drain-source voltage is properly biased. Thus the circuit, although constructed in a simple form, has the capability of variable open loop gain control which can correctly work regardless of the variation in the power supply voltage.

Still further, the constant voltage power supply circuit is a regulator which supplies a constant voltage to the gate of the cascode connection FET.

In this circuit configuration, the gate voltage is adjusted by properly selecting the parameters of the regulator so that the drain-source voltage is properly biased. Thus the circuit, although constructed in the simple form, has the capability of variable open loop gain control which can correctly work regardless of the variation in the power supply voltage.

Further, according to another aspect of the present invention, there is provided a negative feedback preamplifier comprising: a grounded source amplifier including a main FET and a load FET, the source of the main FET being grounded, the drain of the load FET being connected to a positive power supply, the source of the load FET being connected to the drain of the main FET, the gate and the source of the load FET being connected to each other; a source follower circuit including: a source follower FET whose drain is connected to the positive power supply and whose gate is connected to the source of the load FET and whose source serves to provide an output; a bias setting portion connected to the source of the source follower FET, for setting the bias associated with the main FET; and a constant-current source FET whose drain is connected to the other terminal of the bias setting portion, and whose gate and source are connected to each other and further connected to a negative power supply with a voltage lower than that of the positive power supply; and a feedback resistor connected between the gate of the main FET and the drain of the constant-current source FET, the feedback resistor serving to determine the current-voltage conversion gain when a small signal current is input to the negative feedback preamplifier; wherein when a large signal current is input to the negative feedback amplifier, the bias setting portion sets the bias condition so that the drain-source voltage of the main FET becomes equal to or smaller than the pinch-off voltage thereby reducing the transconductance of the main FET.

In this circuit configuration, when a large input signal current is applied to the circuit, the transconductance is reduced instead of reducing the load resistance thereby ensuring that the circuit, although constructed in the simple fashion, has the ability to correctly and variably control the open loop gain regardless of the variation in the power supply voltage.

Furthermore, according to still another aspect of the present invention, there is provided a negative feedback preamplifier comprising: a grounded source amplifier including: a main FET; a source voltage setting portion disposed between the main FET and ground, for controlling the source voltage of the main FET; and a load FET whose source is connected to the drain of the main FET and whose gate and source are connected to each other; a source follower circuit including: a source follower FET whose gate is connected to the source of the load FET and whose source serves to provide an output; a bias setting portion connected to the source of the source follower FET, for setting the bias associated with the main FET; and a constant-current source FET whose drain is connected to the other terminal of the bias setting portion and whose gate and source are connected to each other and further to ground; a feedback resistor connected between the gate of the main FET and the drain of the constant-current source FET, the feedback resistor serving to determine the current-voltage conversion gain when a small signal current is input to the negative feedback preamplifier; and a series connection of a diode and a resistor which is connected in parallel to the feedback resistor in such a manner that the anode of the diode is connected to the gate of the main FET wherein when a large signal current is input to the negative feedback preamplifier, the current-voltage conversion gain is switched by the diode and the current-voltage conversion gain is determined by the resistor.

In this circuit configuration, the diode, which acts to switch the current-voltage conversion gain when a large signal current is input to the circuit, is connected in series to the resistor so that the variable conversion gain is correctly controlled regardless of the variations associated with the above diode caused by semiconductor process variations. Furthermore, in this circuit configuration, the source voltage setting portion allows the circuit to operate with a single power supply, which makes it possible to construct the circuit in a more simplified fashion.

Moreover, the bias setting portion sets the bias condition so that when a large signal current is input to the negative feedback amplifier, the drain-source voltage of the main FET becomes equal to or smaller than the pinch-off voltage thereby reducing the transconductance of the main FET.

In this circuit configuration, the diode which acts to switch the current-voltage conversion gain when a large signal current is input to the circuit is connected in series to the resistor so that the variable conversion gain is correctly controlled regardless of the variations associated with the above diode caused by semiconductor process variations. Furthermore, in this circuit configuration, when a large input signal current is applied to the circuit, the transconductance is reduced instead of reducing the load resistance thereby ensuring that the circuit, although constructed in the simple fashion, has the capability of variable open loop gain control which can work correctly regardless of the variation in the power supply voltage. Furthermore, in this circuit configuration, the source voltage setting portion allows the circuit to operate with a single power supply, which makes it possible to construct the circuit in a more simplified fashion.

Moreover, the source voltage setting portion comprises a plurality of diodes connected in series, the anode end of the series of diodes being connected to the source of the main FET, the cathode end of the series of diodes being grounded.

Thus, this source voltage setting portion in the simple circuit form is capable of supplying a constant voltage to the source of the main FET, which allows the negative feedback preamplifier to operate with a signal power supply.

Still further, the source voltage setting portion is a Zener diode whose anode is connected to the source of the main FET and whose cathode is grounded.

Thus, this source voltage setting portion in the simple circuit form is capable of supplying a constant voltage to the source of the main FET, which allows the negative feedback preamplifier to operate with a signal power supply.

Further, the source voltage setting portion is a resistor disposed between the source of the main FET and ground.

Thus, this source voltage setting portion in the simple circuit form is capable of supplying a constant voltage to the source of the main FET, which allows the negative feedback preamplifier to operate with a signal power supply.

According to still another aspect of the present invention, there is provided a negative feedback preamplifier comprising: a grounded source amplifier including: a main FET; a source voltage setting portion disposed between the main FET and ground, for setting the source voltage of the main FET; and a load FET whose source is connected to the drain of the main FET and whose gate and source are connected to each other; a source follower circuit including: a source follower FET whose gate is connected to the source of the load FET and whose source serves to provide an output; a bias setting portion connected to the source of the source follower FET, for setting the bias associated with the main FET; and a constant-current source FET whose drain is connected to the other terminal of the bias setting portion and whose gate and source are connected to each other and further connected to ground; and a feedback resistor connected between the gate of the main FET and the drain of the constant-current source FET, the feedback resistor serving to determine the current-voltage conversion gain when a small signal current is input to the negative feedback preamplifier; wherein when a large signal current is input to the negative feedback amplifier, the bias setting portion sets the bias condition so that the drain-source voltage of the main FET becomes equal to or smaller than the pinch-off voltage thereby reducing the transconductance of the main FET.

In this circuit configuration, when a large input signal current is applied to the circuit, the transconductance is reduced instead of reducing the load resistance thereby ensuring that the circuit, although constructed in the simple fashion, has the ability to correctly and variably control the open loop gain regardless of the variation in the power supply voltage. Furthermore, in this circuit configuration, the source voltage setting portion allows the circuit to operate with a single power supply, which makes it possible to construct the circuit in a more simplified fashion.

What is claimed is:

1. A negative feedback preamplifier comprising:

a grounded source amplifier including a main FET and a load FET, the source of said main FET being grounded, the drain of said load FET being connected to a positive power supply, the source of said load FET being connected to the drain of said main FET, the gate and the source of said load FET being connected to each other;

a source follower circuit including: a source follower FET whose drain is connected to said positive power supply and whose gate is connected to the source of said load FET and whose source serves to provide an output; a bias setting portion connected to the source of said source follower FET, for setting the bias associated with said main FET; and a constant-current source FET whose drain is connected to the other terminal of said bias setting portion, and whose gate and source are connected to each other and further connected to a negative power supply with a voltage lower than that of said positive power supply;

a feedback resistor connected between the gate of said main FET and the drain of said constant-current source FET, said feedback resistor serving to determine the current-voltage conversion gain when a small signal current is input to said negative feedback preamplifier; and a series connection of a diode and a resistor which is connected in parallel to said feedback resistor in such a manner that the anode of said diode is connected to the gate of said main FET wherein when a large signal current is input to said negative feedback preamplifier, the current-voltage conversion gain is switched by said diode and the current-voltage conversion gain is determined by said resistor;

wherein said bias setting portion sets the bias condition so that when a large signal current is input to said negative feedback amplifier, the drain-source voltage of said main FET becomes equal to or smaller than the pinch-off voltage thereby reducing the transconductance of said main FET.

2. The negative feedback preamplifier according to claim 1, wherein said bias setting portion comprises a plurality of bias setting diodes connected in series, the anode end of the series of bias setting diodes being connected to the source of said source follower FET, the number of bias setting diodes being selected so that when a large signal current is input to said negative feedback preamplifier the drain-source voltage of said main FET becomes equal to or smaller than the pinch-off voltage thereby reducing the transconductance of said main FET.

3. The negative feedback preamplifier according to claim 1, wherein said bias setting portion is a Zener diode whose cathode is connected to the source of said source follower FET, the Zener voltage of said Zener diode being selected so that when a large signal current is input to said negative feedback preamplifier the drain-source voltage of said main FET becomes equal to or smaller than the pinch-off voltage thereby reducing the transconductance of said main FET.

4. The negative feedback preamplifier according to claim 1, wherein said bias setting portion is a resistor having a resistance value selected so that when a large signal current is input to said negative feedback preamplifier the drain-source voltage of said main FET becomes equal to or smaller than the pinch-off voltage thereby reducing the transconductance of said main FET.

5. The negative feedback preamplifier according to claim 1, wherein:
   said grounded source amplifier further includes: a current injection FET whose gate and source are connected to each other and further connected to the drain of said main FET so that a DC bias current is provided into said main FET; and a cascode connection FET disposed between said main FET and said load FET, the drain of said cascode connection FET being connected to the source of said load FET, the source of said cascode connection FET being connected to the drain of said main FET, the gate of said cascode connection FET being connected to a constant-voltage source, whereby said grounded source amplifier operates as a current injection type grounded source amplifier; and
   said bias setting portion sets the bias condition in such a manner that when a large signal current is input to said negative feedback amplifier the drain-source voltage of said cascode connection FET becomes equal to or smaller than the pinch-off voltage.

6. The negative feedback preamplifier according to claim 5, further comprising a constant voltage power supply circuit for setting the gate voltage of said cascode connection FET.

7. The negative feedback preamplifier according to claim 6, wherein said constant voltage power supply circuit includes: a gate voltage setting constant-current source FET whose gate and source are connected to each other and further connected to the gate of said cascode connection FET; and a gate voltage setting portion for setting the gate voltage of said cascode connection FET.

8. The negative feedback preamplifier according to claim 7, wherein said gate voltage setting portion comprises a plurality of diodes connected in series, the anode end of the series of said diodes being connected to the source of said gate voltage control constant-current source FET.

9. The negative feedback preamplifier according to claim 7, wherein said gate voltage setting portion is a Zener diode whose cathode is connected to the source of said gate voltage setting constant-current source FET.

10. The negative feedback preamplifier according to claim 8, wherein said gate voltage setting portion is a resistor.

11. The negative feedback preamplifier according to claim 6, wherein said constant voltage power supply circuit is a regulator which supplies a constant voltage to the gate of said cascode connection FET.

12. A negative feedback preamplifier comprising:
    a grounded source amplifier including a main FET and a load FET, the source of said main FET being grounded, the drain of said load FET being connected to a positive power supply, the source of said load FET being connected to the drain of said main FET, the gate and the source of said load FET being connected to each other;
    a source follower circuit including: a source follower FET whose drain is connected to said positive power supply and whose gate is connected to the source of said load FET and whose source serves to provide an output; a bias setting portion connected to the source of said source follower FET, for setting the bias associated with said main FET; and a constant-current source FET whose drain is connected to the other terminal of said bias setting portion, and whose gate and source are connected to each other and further connected to a negative power supply with a voltage lower than that of said positive power supply; and
    a feedback resistor connected between the gate of said main FET and the drain of said constant-current source FET, said feedback resistor serving to determine the current-voltage conversion gain when a small signal current is input to said negative feedback preamplifier;
    wherein when a large signal current is input to said negative feedback amplifier, said bias setting portion sets the bias condition so that the drain-source voltage of said main FET becomes equal to or smaller than the pinch-off voltage thereby reducing the transconductance of said main FET.

13. A negative feedback preamplifier comprising:
    a grounded source amplifier including: a main FET; a source voltage setting portion disposed between said main FET and ground, for controlling the source voltage of said main FET; and a load FET whose source is connected to the drain of said main FET and whose gate and source are connected to each other:
    a source follower circuit including: a source follower FET whose gate is connected to the source of said load FET and whose source serves to provide an output; a bias setting portion connected to the source of said source follower FET, for setting the bias associated with said main FET; and a constant-current source FET whose drain is connected to the other terminal of said bias setting portion and whose gate and source are connected to each other and further to ground;
    a feedback resistor connected between the gate of said main FET and the drain of said constant-current source FET, said feedback resistor serving to determine the current-voltage conversion gain when a small signal current is input to said negative feedback preamplifier; and
    a series connection of a diode and a resistor which is connected in parallel to said feedback resistor in such a manner that the anode of said diode is connected to the gate of said main FET wherein when a large signal current is input to said negative feedback preamplifier, the current-voltage conversion gain is switched by said diode and the current-voltage conversion gain is determined by said resistor;
    wherein said bias setting portion sets the bias condition so that when a large signal current is input to said negative feedback amplifier, the drain-source voltage of said main FET becomes equal to or smaller than the pinch-off voltage thereby reducing the transconductance of said main FET.

14. The negative feedback preamplifier according to claim 13, wherein said source voltage setting portion comprises a plurality of diodes connected in series, the anode end of said series of diodes being connected to the source of said main FET, the cathode end of said series of diodes being grounded.

15. The negative feedback preamplifier according to claim 13, wherein said source voltage setting portion is a Zener diode whose anode is connected to the source of said main FET and whose cathode is grounded.

16. The negative feedback preamplifier according to claim 13, wherein said source voltage setting portion is a resistor disposed between the source of said main FET and ground.

17. A negative feedback preamplifier comprising:
    a grounded source amplifier including: a main FET; a source voltage setting portion disposed between said main FET and ground, for setting the source voltage of said main FET; and a load FET whose source is connected to the drain of said main FET and whose gate and source are connected to each other;

a source follower circuit including: a source follower FET whose gate is connected to the source of said load FET and whose source serves to provide an output; a bias setting portion connected to the source of said source follower FET, for setting the bias associated with said main FET; and a constant-current source FET whose drain is connected to the other terminal of said bias setting portion and whose gate and source are connected to each other and further connected to ground; and a feedback resistor connected between the gate of said main FET and the drain of said constant-current source FET, said feedback resistor serving to determine the current-voltage conversion gain when a small signal current is input to said negative feedback preamplifier;

wherein when a large signal current is input to said negative feedback amplifier, said bias setting portion sets the bias condition so that the drain-source voltage of said main FET becomes equal to or smaller than the pinch-off voltage thereby reducing the transconductance of said main FET.

* * * * *